United States Patent
Nozawa

(10) Patent No.: US 10,045,442 B2
(45) Date of Patent: Aug. 7, 2018

(54) ELECTRONIC CIRCUIT COMPONENT MOUNTER

(71) Applicant: FUJI MACHINE MFG. CO., LTD., Chiryu-shi (JP)

(72) Inventor: Mizuho Nozawa, Chiryu (JP)

(73) Assignee: FUJI MACHINE MFG. CO., LTD., Chiryu-shi (JP)

( * ) Notice: Subject to any disclaimer, the term of this patent is extended or adjusted under 35 U.S.C. 154(b) by 518 days.

(21) Appl. No.: 14/429,541

(22) PCT Filed: Jun. 26, 2013

(86) PCT No.: PCT/JP2013/067523
§ 371 (c)(1),
(2) Date: Mar. 19, 2015

(87) PCT Pub. No.: WO2014/045663
PCT Pub. Date: Mar. 27, 2014

(65) Prior Publication Data
US 2015/0237740 A1    Aug. 20, 2015

(30) Foreign Application Priority Data

Sep. 20, 2012   (WO) .................. PCT/JP2012/074105
Sep. 20, 2012   (WO) .................. PCT/JP2012/074106

(51) Int. Cl.
*H05K 3/30*   (2006.01)
*H05K 13/04*  (2006.01)
(Continued)

(52) U.S. Cl.
CPC ......... *H05K 3/301* (2013.01); *H05K 13/0434* (2013.01); *H05K 13/08* (2013.01);
(Continued)

(58) Field of Classification Search
CPC ......... Y10T 29/53174; Y10T 29/53178; Y10T 29/53191; Y10T 29/53252;
(Continued)

(56) References Cited

U.S. PATENT DOCUMENTS

| 5,325,305 A | * | 6/1994 | Rezaei | G05B 19/4183 29/832 |
| 5,400,497 A | * | 3/1995 | Watanabe | H05K 13/0404 29/705 |

(Continued)

FOREIGN PATENT DOCUMENTS

| JP | 6-29693 A | | 2/1994 |
| JP | 11046092 A | * | 2/1999 |

(Continued)

OTHER PUBLICATIONS

Machine translation of description section of JP H11-46092 translated by EPO website (Espacenet.com).*

(Continued)

*Primary Examiner* — Peter DungBa Vo
*Assistant Examiner* — Joshua D Anderson
(74) *Attorney, Agent, or Firm* — Oblon, McClelland, Maier & Neustadt, L.L.P.

(57) ABSTRACT

An electronic circuit component mounter including a component supply device which supplies electronic circuit components to a component holding tool; and a mounting device including a component holding tool and a movable device to move the tool relative to a substrate. If a moving type component supply mounting supply mode is set, a passage-equipped component case is checked for, passage-equipped component case is attached to head main body, moved together with suction nozzle, and supplies components. When component mounting by performing main body side component supply mounting supply mode is set, compo- (Continued)

nents supplied from tape feeders provided on the module main body are mounted, thus passage-equipped component case is not required, the presence of passage-equipped component case is checked for, and if it is attached to head main body, it is removed.

5 Claims, 18 Drawing Sheets

(51) Int. Cl.
*H05K 13/08* (2006.01)
*H05K 13/00* (2006.01)
*H05K 13/02* (2006.01)

(52) U.S. Cl.
CPC ....... *H05K 13/0084* (2013.01); *H05K 13/021* (2013.01); *Y10T 29/53174* (2015.01)

(58) Field of Classification Search
CPC ......... Y10T 29/53261; Y10T 29/53313; Y10T 29/53378; Y10T 29/53478; Y10T 29/5303; Y10T 29/53061; H05K 3/301; H05K 13/0015; H05K 13/0084; H05K 13/02; H05K 13/021; H05K 13/022; H05K 13/028; H05K 13/029; H05K 13/04; H05K 13/0404; H05K 13/0408; H05K 13/0413; H05K 13/0417; H05K 13/043; H05K 13/0434; H05K 13/0452; H05K 13/0478
USPC ......... 29/739, 740, 743, 757, 759, 771, 786, 29/809, 707, 714
See application file for complete search history.

(56) References Cited

U.S. PATENT DOCUMENTS

| | | | | |
|---|---|---|---|---|
| 6,195,876 | B1* | 3/2001 | Koyama | H05K 13/028 29/33 J |
| 7,273,166 | B2* | 9/2007 | Suhara | H05K 13/0417 235/376 |
| 2004/0130863 | A1* | 7/2004 | Shimizu | H05K 13/0417 361/679.01 |
| 2006/0207089 | A1* | 9/2006 | Maenishi | H05K 13/0452 29/832 |
| 2006/0208058 | A1* | 9/2006 | Kodama | H05K 13/0417 235/376 |
| 2008/0217394 | A1* | 9/2008 | Okada | H05K 13/0417 235/375 |

FOREIGN PATENT DOCUMENTS

| | | |
|---|---|---|
| JP | 2002-280793 A | 9/2002 |
| JP | 2007-299868 A | 11/2007 |
| JP | 2008-270332 A | 11/2008 |
| JP | 2008-311509 A | 12/2008 |
| JP | 2010-228912 A | 10/2010 |

OTHER PUBLICATIONS

International Search Report dated Aug. 13, 2013 in PCT/JP2013/067523 Filed Jun. 26, 2013.
U.S. Appl. No. 14/429,564, filed Mar. 19, 2015, Nozawa.
Japanese Office Action dated Jan. 10, 2017 in patent application No. 2014-536629 with unedited computer generated English translation.
Extended European Search Report dated Jul. 19, 2016 in Patent Application No. 13839115.6.

* cited by examiner

ELECTRONIC CIRCUIT COMPONENT MOUNTER

TECHNICAL FIELD

The present disclosure relates to an electronic circuit component mounter, in particular it relates to an electronic circuit component mounter equipped with a moving type component supply device which supplies electronic circuit components to a component holding tool and which is moved together with the component holding tool.

BACKGROUND ART

This kind of electronic circuit component mounter is disclosed in patent literature 1. This electronic circuit component mounter comprises a bulk component supply device which is provided on a mounting head and moved together with a pickup device, and a fixed type electronic circuit component supply device which is provided fixedly and separated from a mounting head. The bulk component supply device supplies electronic circuit components with a high mounting frequency; the fixed type electronic circuit component supply device supplies electronic circuit components with a low mounting frequency. When mounting electronic circuit components with a high mounting frequency, the pickup device takes electronic circuit components from the bulk component supply device while being moved to a component mounting position specified on a board and mounts them on the board; when mounting electronic circuit components with a low mounting frequency, the pickup/mounting device is moved to a board and performs mounting after being moved to a fixed type electronic circuit component supply device and taking out an electronic circuit component.

CITATION LIST

Patent Literature

Patent Literature 1
JP-A-2002-280793

SUMMARY

Problem to be Solved

The present disclosure, taking account of the above background circumstances, relates to improving the practicality of an electronic circuit component mounter equipped with a moving type component supply device which supplies electronic circuit components to a component holding tool and which is moved together with the component holding tool.

Means for Solving the Problem

The above problem is solved by an electronic circuit component mounter, including: (A) a substrate holding device to hold a circuit substrate; (B) a component supply device to supply electronic circuit components; (C) a mounting device, including (a) a component holding tool, (b) a movable member to hold that component holding tool, and (c) a moving device to move at least that movable member relative to the substrate holding device; and (D) a control device to control the mounting device so that electronic circuit components are received by the component holding tool from the component supply device and mounted on the circuit substrate held by the substrate holding device, wherein the component supply device includes a moving type component supply device which is held on the movable member and moved together with the component holding tool by the moving device and supplies electronic circuit components to that component holding tool, wherein the moving type component supply device includes at least a component storage section which stores multiple electronic circuit components and being equipped with a detachable section which is detachable with a movable member side section which is a section on the movable member side, and wherein the electronic circuit component mounter includes at least one of: a detachable section presence judging section which judges whether that detachable section is attached to the movable member side section; and a detachable section required judging section which judges whether it is required to attach the detachable section to the movable member side section.

Included in circuit substrate are, for example, (a) a printed wiring board on which electronic circuit components have not yet been mounted; (b) a printed circuit board on one side of which electronic circuit components have been loaded and electrically connected, and on the other side of which electronic circuit components have not yet been mounted; (c) a substrate configured from a chip-equipped board on which a bare chip has been loaded; (d) a substrate on which is loaded an electronic circuit component provided with a ball grid array; and (e) a substrate which is not a flat board but which is three dimensional.

For component holding tools, there are, for example, suction nozzles which pick up electronic circuit components by using negative pressure, and component gripping tools which are equipped with multiple gripping members wherein those gripping members are moved relative to each other to grip and release a component.

One section of the moving type component supply device may be the detachable section, or the entire thing may be the detachable section. Which is the "movable member side section" is decided based mainly on the detachable section, which may be the movable member itself, or the movable member and a member fixedly attached to a movable member. When a section of the moving type component supply device is the detachable section, the section which is not the detachable section of the moving type component supply device is also a movable member side section.

The moving type component supply device may also be a device which supplies components from an arranged-component feeder, or a device which supplies components from a tray. For arranged-component feeders, there are, for example, bulk feeders, tape feeders, and stick feeders, and so on.

The moving type component supply device supplies electronic circuit components while being moved together with the component holding tool.

Therefore, the component supply device performs mounting of electronic circuit components more efficiently compared to cases in which, as when the component supply device is provided on a section which is not moved together with the component holding tool, the component holding tool moves back and forth between the component supply device and the circuit substrate holding device, and receives electronic circuit components from the component supply device and mounts them on a circuit substrate. If at least a section including a component storage section is made to be detachable on a moving type component supply device such as this, by the electronic circuit component mounter being operated and so on after selecting between a state in which the detachable section is attached and a state in which the detachable section is not attached, and the detachable section being attached/detached with respect to the movable member side section, for example, the moving type component supply device can easily perform component replenishment or changing of the type of the electronic circuit component being supplied.

And, if a detachable section presence judging section is provided, it can be automatically checked whether a detachable section is attached to the movable member side section.

Also, if a detachable section required judging section is provided, it can be automatically judged whether attachment of a detachable section to the movable member side section is required, and based on that judgment, a detachable section is attached to the movable member side section if it is required, and a detachable section is not attached to the movable member side section if it is not required, thereby increasing the practicality of the electronic circuit component mounter.

For example, if a detachable section is not attached to the movable member side section when a detachable section is not required, the weight of the movable member side section is smaller so the control parameters of the moving device can be changed and the moving acceleration and deceleration can be made larger to improve mounting efficiency: Also, the energy consumption required for moving can be reduced. In particular, in cases in which the moving type component supply device is a bulk component supply device, when electronic circuit components of a different type to the bulk components are mounted on a circuit substrate, if a detachable section is not attached to the movable member side section, unnecessary advancement of the blackening of bulk components can be avoided, and the usage lifespan can be lengthened. Also, in cases in which a detachable section is required, by making it such that a detachable section is attached to the movable member side section, starting mounting work of electronic circuit components supplied from the moving type component supply device to a circuit substrate while there is no detachable section can be avoided.

If both a detachable section required judging section and a detachable section presence judging section are provided, in cases in which the presence of a detachable section as decided by the judgment of the detachable section required judging section, and the judgment result of the detachable section presence judging section, do not match, by making it such that the mismatch situation is resolved, performing mounting of electronic circuit components in a state contrary to whether a detachable section is required can be easily avoided.

Figure 1:
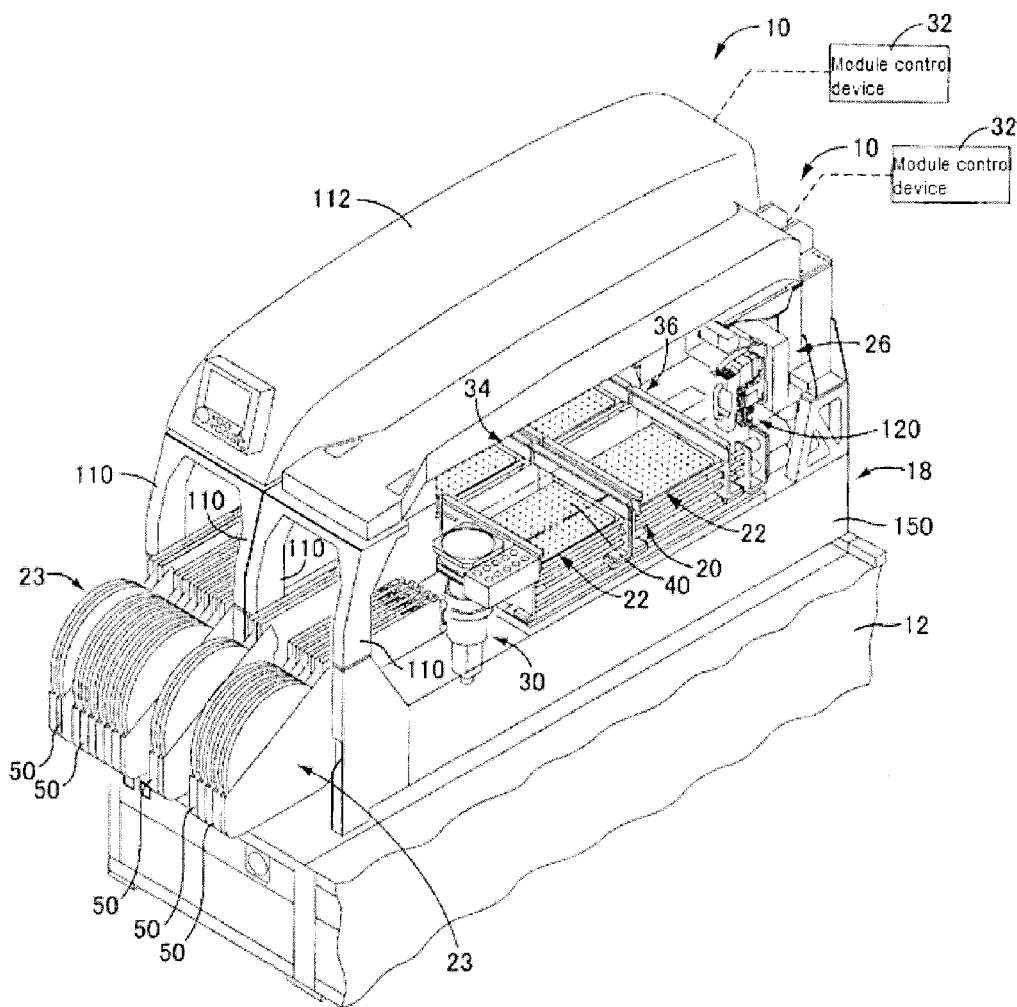
FIG. 1

This is a perspective view showing a section of an electronic circuit component mounting line equipped with multiple mounter modules which form the electronic circuit component mounter of an embodiment of the present disclosure.

FIG. 2

This is a side view (partial cross section) showing the tape feeder of the component supply device of the above mounter module.

FIG. 3

This is a perspective view showing the mounting head and head moving device of the above mounter module.

FIG. 4

This is a perspective view showing the above mounting head.

FIG. 5

This is a perspective view showing the area around the component mounting position of the above mounting head.

FIG. 6

This is a perspective view showing the area around the component takeout position of the above mounting head.

FIG. 7

This is a side view showing the passage-equipped component case of the moving type bulk component supply device provided at the above component takeout position.

FIG. 8

This is a perspective view showing the above passage-equipped component case.

FIG. 9

This is a side view (partial cross section) showing the component driving device and passage-equipped component case attachment device of the above moving type bulk component supply device, and showing the unclamped state of the passage-equipped component case attachment device.

FIG. 10

This is a side view (partial cross section) showing the clamped state of the above passage-equipped component case attachment device.

FIG. 11

This is a perspective view showing the state of the head main body, suction nozzles, and moving type bulk component supply device of the above mounting head as seen from above.

FIG. 12

This is a perspective view showing the above mounting head as seen from below.

FIG. 13

This is a perspective view showing the state of the above passage-equipped component case, dropped component catch plate, and lighting device and so on as seen from above.

FIG. 14

This is a side cutout view showing the above lighting device.

FIG. 15

This is a perspective view showing both the storage-section-use component sensor and guiding-passage-use component sensor of the above moving type bulk component supply device.

FIG. 16

This is a side view illustrating the arrangement of the storage-section-use component sensor with respect to the above passage-equipped component case.

FIG. 17

This is a perspective view showing the guiding-passage-use component sensor and area around the component supply section of the above passage-equipped component case.

FIG. 18

This is a side view (partial cross section) showing the passage-equipped component case exchange device which exchanges the above passage-equipped component case.

FIG. 19

This is a top view showing the component case holding/raising/lowering device of the above passage-equipped component case exchange device.

FIG. 20

This is a side view showing the component case holding/raising/lowering device of the above passage-equipped component case exchange device.

FIG. 21

This is a block diagram showing conceptually module control device which controls the above mounter module.

FIG. 22

These are drawings to illustrate the exchange of passage-equipped component cases by the above passage-equipped component case exchange device.

DESCRIPTION OF EMBODIMENTS

Below, an embodiment of the present disclosure is described with reference to the figures. It should be noted that for the present disclosure, as well as the below embodiment, embodiments with various changes based on the knowledge of someone skilled in the art are possible.

An electronic circuit component mounting system including multiple mounter modules 10 which form an electronic circuit component mounter is shown in FIG. 1. These mounter modules 10 are arranged in a line adjacent to each other on top of a shared single body base 12 to configure a mounting line. With regard to mounter module 10, details are disclosed, for example, in JP-A-2004-104075, and the sections except those sections which relate to the present disclosure are described simply below.

Figure 3:
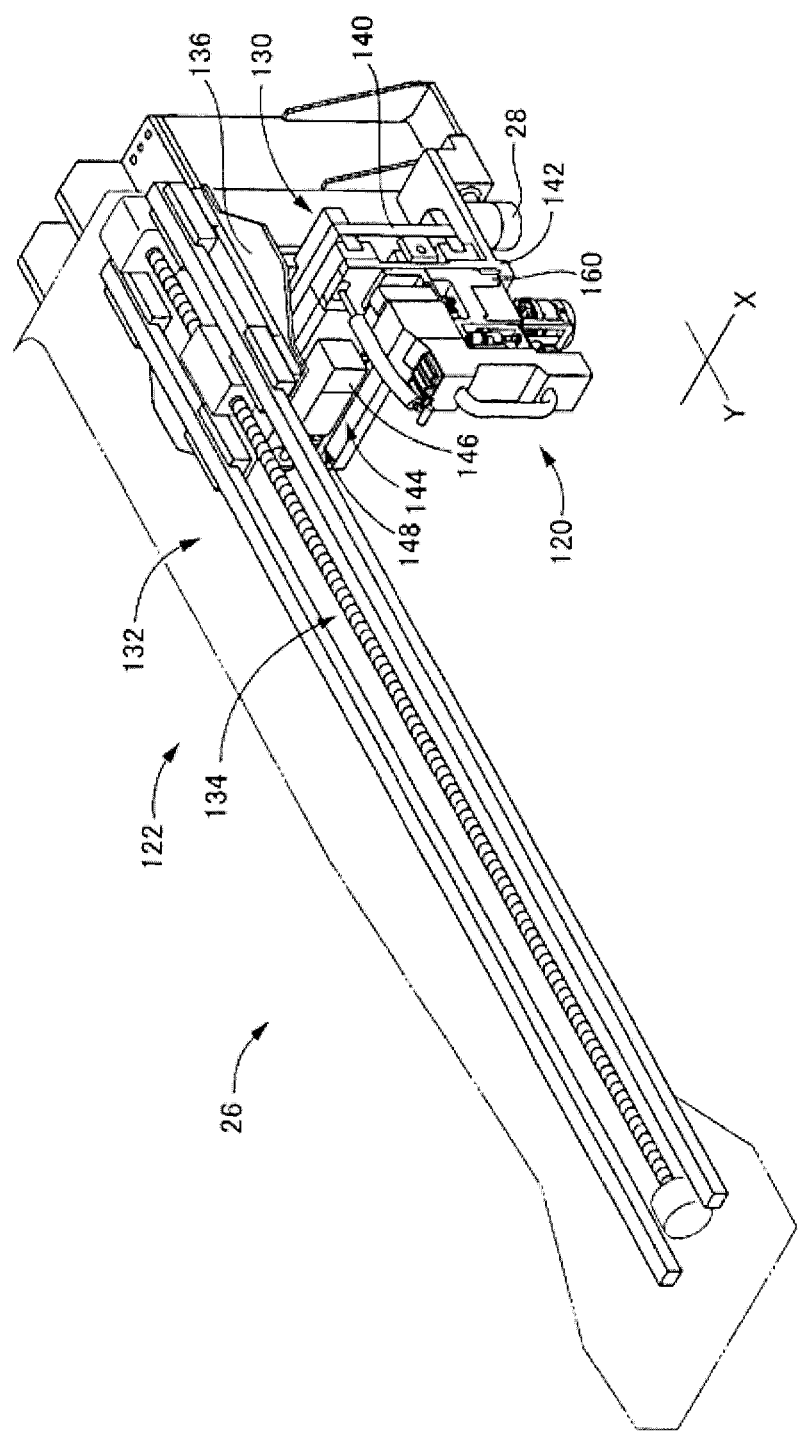
Figure 4:
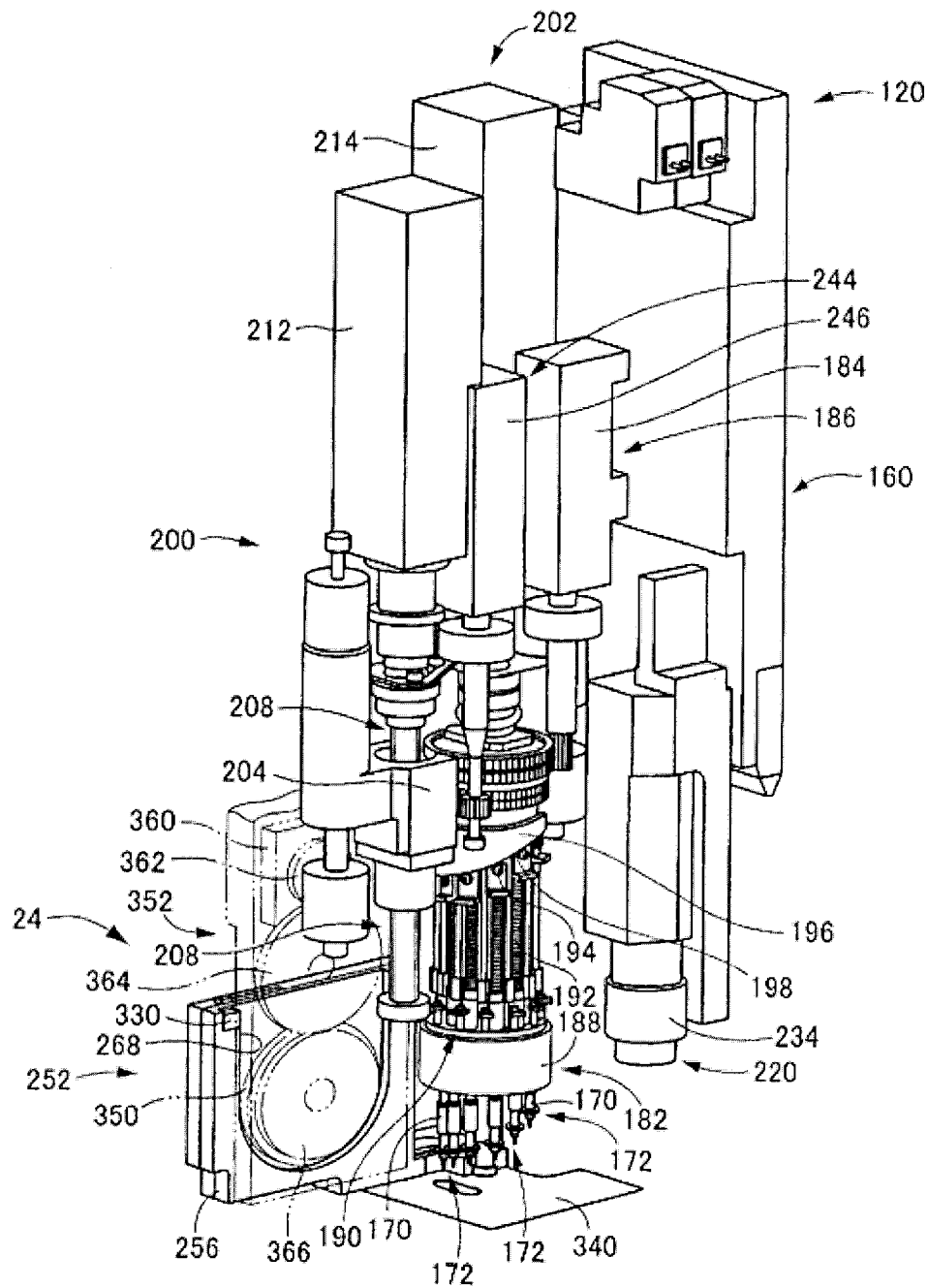

Mounter module 10 is, in the present embodiment, as shown in FIG. 1, equipped with module main body 18 which forms the main body of the electronic circuit component mounter, circuit board conveyance device 20 (hereafter abbreviated to as board conveyance device 20) which forms the circuit substrate conveyance device, circuit board holding device 22 (hereafter abbreviated to as board holding device 22) which forms the circuit substrate holding device, module main body side component supply device 23 which forms the mounter main body side component supply device, moving type bulk component supply device 24 (refer to FIG. 4. Hereafter abbreviated to bulk component supply device) which is a type of moving type component supply device, mounting device 26, reference mark imaging device 28 (refer to FIG. 3), component imaging device 30, passage-equipped component case exchange device 31 (refer to FIG. 18) as a component case exchange device which is a type of detachable section exchange device, and module control device 32.

As shown in FIG. 1, board conveyance device 20, in the present embodiment, is equipped with two board conveyors 34 and 36, and conveys circuit board 40 (hereafter abbreviated to board 40) which is a type of circuit substrate in a horizontal direction which is a direction parallel to the direction in which multiple mounter modules 10 are lined up. In this embodiment, "circuit board" is used as a general term for printed wiring boards and printed circuit boards. Board holding device 22 is provided on each of the two board conveyors 34 and 36 on module main body 18, and although omitted from the figure, each is equipped with a supporting member for supporting board 40 from below and a clamping member for clamping the edge section on each side in a direction parallel to the conveyance direction of board 40, and holds board 40 with the component mounting surface onto which electronic circuit components (hereafter abbreviated to components) are mounted in a horizontal orientation. In this embodiment, the conveyance direction of board 40 by board conveyance device 20 is the X-axis direction, or the left-right direction; and the Y-axis direction, or the front-rear direction, is in a flat plane parallel to the component mounting surface of board 40 held in board holding device 22 and is perpendicular to the X-axis direction in that horizontal plane. Also, the Z-axis direction is the perpendicular direction to the X-axis direction and Y-axis direction. In the present embodiment, the Z-axis direction is the vertical direction or up/down direction.

Figure 2:
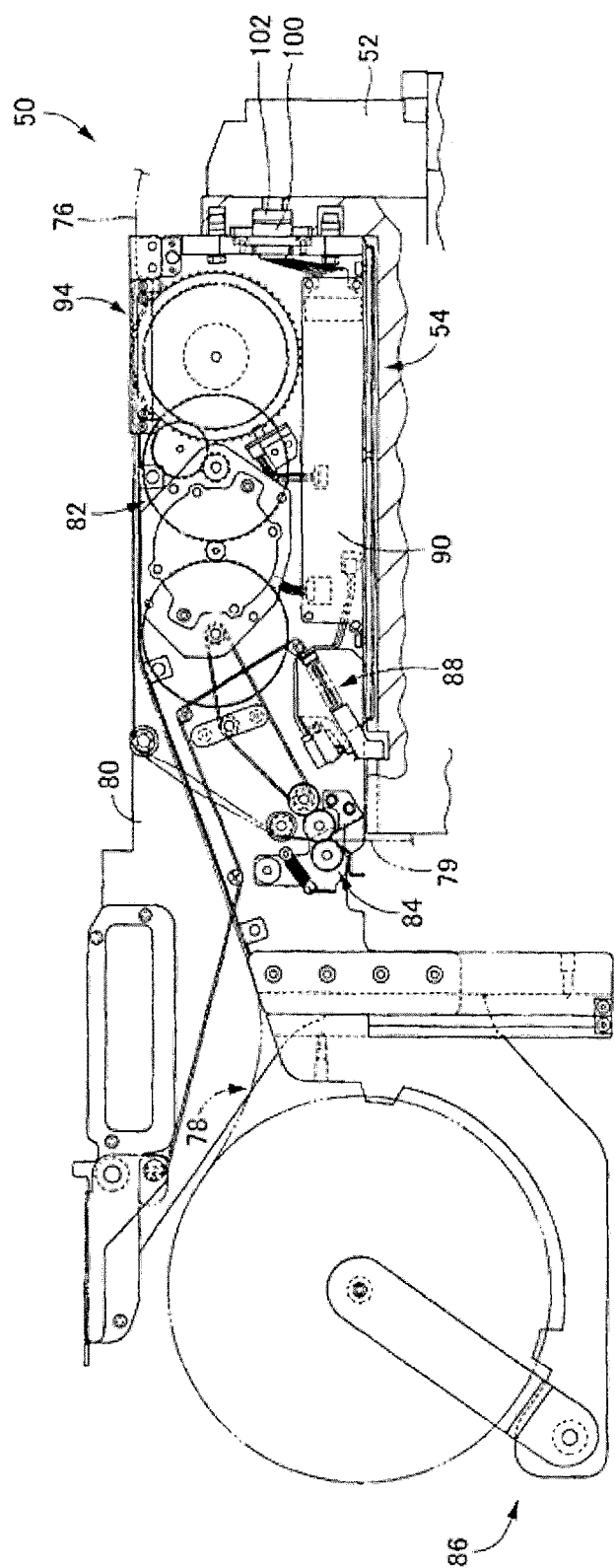

This module main body side component supply device 23 has the same kind of configuration as the component supply device disclosed in JP-A-2013-69798 and is described simply below. Module main body side component supply device 23 is provided on one side of board conveyance device 20 in the Y-axis direction, and supplies components from multiple tape feeders 50 which form arranged component feeders. These tape feeders 50, as shown in FIG. 2, are detachably attached to attachment table 52. Multiple installation sections 54 are provided on attachment table 52 appropriately spaced in a direction parallel to the left/right direction, and on this attachment table 52 are provided evenly spaced. It should be noted that, with regard to the overall mounter module 10, the side on which module main body side component supply device 23 is provided in the Y-axis direction is the front side or the facade, and the board conveyance device 20 side is the rear side; but with regard to attachment table 52, tape feeders 50, and passage-equipped component case exchange device 31, conversely, in the Y-axis direction, the board conveyance device 20 side is the front and the module main body side component supply device 23 side is the rear.

In multiple tape feeders 50, as shown by one tape feeder 50 in FIG. 2, respective components are held by component holding tape 76, and supplied as taped components 78. Multiple of one type of component are held in component holding tape 76 arranged in a line and spaced at regular intervals and are covered by cover tape 79. transfer device 82, cover tape peeling device 84, component storage device 86, engaging device 88, and tape feeder control device 90 are provided on feeder main body 80 which is the main body of tape feeder 50.

transfer device 82 transfers taped components 78 a predetermined distance each time, which in the present embodiment is a distance equal to the holding interval of the components of component holding tape 76; and for electronic circuit components which are the arranged components held in component holding tape 76, cover tape 79 is peeled by cover tape peeling device 84, and the electronic circuit components are positioned one by one at the component supply position. The component supply position is set at the front end of feeder main body 80 which is an end in the lengthwise direction or the front-rear direction; this section configures component supply section 94, and electronic circuit components are supplied from component supply section 94 consecutively one by one.

As well as a tape feeder 50 being positioned in one of the multiple installation sections 54 of attachment table 52 in an orientation in which the lengthwise direction is parallel to the Y-axis direction and the left-right direction or the widthwise direction is parallel to the X-axis direction, tape feeder 50 is held in a state which prevents it from rising up from attachment table 52 and fixed to attachment table 52 by engaging device 88. Also, for tape feeder 50, connector 100 which is provided on the front surface of feeder main body 80 is connected to connector 102 of attachment table 52. A connector 102 is provided for each of the multiple installation sections 54. By the connection of connectors 100 and 102, communication can be performed between tape feeder control computer 104 which forms the main part of tape feeder control device 90 and module control computer 106 (refer to FIG. 21) which forms the main part of the module control device 32, and electric power can be supplied to tape feeder 50. transfer device 82 and cover tape peeling device 84 are controlled by tape feeder control device 90. In an attached state, the front of tape feeder 50 is positioned inside a space inside the module, and component storage device 86 is positioned outside the space inside the module. The space inside the module is the space enclosed by cover 112 and column sections 110 of module main body 18 (refer to FIG. 1).

As shown in FIG. 3, the mounting device 26 includes mounting head 120 and head moving device 122. Head moving device 122 is equipped with X-axis direction moving device 130 and Y-axis direction moving device 132. Y-axis direction moving device 132 is equipped with linear motor 134 provided on module main body 18 straddling the component supply section of module main body side component supply device 23 (the section configured from all the component supply sections 94 in the case in which tape feeders 50 are attached to all the installation sections 54 of attachment table 52) and two board holding devices 22, and moves Y-axis slide 136 acting as a moving member which forms the movable member to any position in the Y-axis direction.

X-axis direction moving device 130 is provided on Y-axis slide 136, and, as well as moving in the X-axis direction with respect to Y-axis slide 136, is equipped with: first and second X-axis slides 140 and 142 acting as movable members which form the moving members moved respectively relatively in the X-axis direction; and X-axis slide moving device 144 (in FIG. 3, X-slide moving device which moves second X-axis slide 142 is shown) for moving each of those slides 140 and 142 in the X-axis direction. The two X-axis slide moving devices, as shown by X-axis slide moving device 144, for example, include electric motor 146 which forms the driving source and transfer screw mechanism 148 which includes a screw axis and nut, with X-axis slides 140 and 142 being able to be moved to any position in the X-axis direction, and second X-axis slide 142 being able to be moved to any position within a horizontal movement plane. A ball screw mechanism is suitable as a transfer screw mechanism. The same is also true for other transfer screw mechanisms described below. The head moving device may have the Y-axis direction moving device provided on the X-axis slide. In the present embodiment, electric motor 146 is configured from a servo motor with an encoder. The servo motor is an electric rotational motor for which the rotational angle can be controlled accurately, but a stepping motor may be used instead of a servo motor. The same is also true for other electric motors described hereafter.

The reference mark imaging device 28, as shown in FIG. 3, is loaded on second X-axis slide 142, is moved together with the mounting head by head moving device 122, and captures images of reference marks (omitted from the figure) provided on board 40. Also, component imaging device 30, as shown in FIG. 1, is provided at a fixed position on the section between board conveyance device 20 of base 150 which configures module main body 18 and module main body side component supply device 23, and captures images of a component which forms the imaging target object from below.

Described below is mounting head 120. Mounting head 120, excluding the sections related to the present disclosure, has the same kind of configuration as the mounting head disclosed in JP-A-2013-69798, and the sections except those sections which relate to the present disclosure are described simply below.

Mounting head 120 includes suction nozzles, and as shown in FIG. 3, is detachably loaded on second X-axis slide 142, and is moved with respect to board holding device 22 according to the movement of second X-axis slide 142, and can be moved to any position in the head moving region which is the moving region straddling the component supply section of module main body side component supply device 23 and the two board holding devices 22.

In the present embodiment, second X-axis slide 142 configures a movable member which holds a component holding tool; and X-axis slide moving device 144 and Y-axis direction moving device 130 which respectively move first X-axis slide 140 and X-axis slides 140 and 142 configure a moving device which moves the movable member with respect to the circuit substrate holding device. The movable member is provided as one body with second X-axis slide 142, and head moving device 122 can be thought of as configuring the moving device which moves the movable member which holds the component holding tool with respect to at least the circuit substrate holding device. Head main body 160 which is the main body of mounting head 120 is fixedly positioned with respect to second X-axis slide 142 in a state in which mounting head 120 is attached to second X-axis slide 142, and in the present embodiment, second X-axis slide 142 and head main body 160 configure the movable member side section which is the section on the side of the movable member.

On this mounter module 10, multiple types of mounting heads with different quantities of nozzle holders which hold a suction nozzle are prepared as mounting head 120, and one is selectably attached to second X-axis slide 142. Mounting head 120 shown in FIG. 3 is equipped with multiple nozzle holders 170, for example three or more, and in the example shown in the figure, twelve such that a maximum of twelve suction nozzles 172 can be held.

Figure 5:
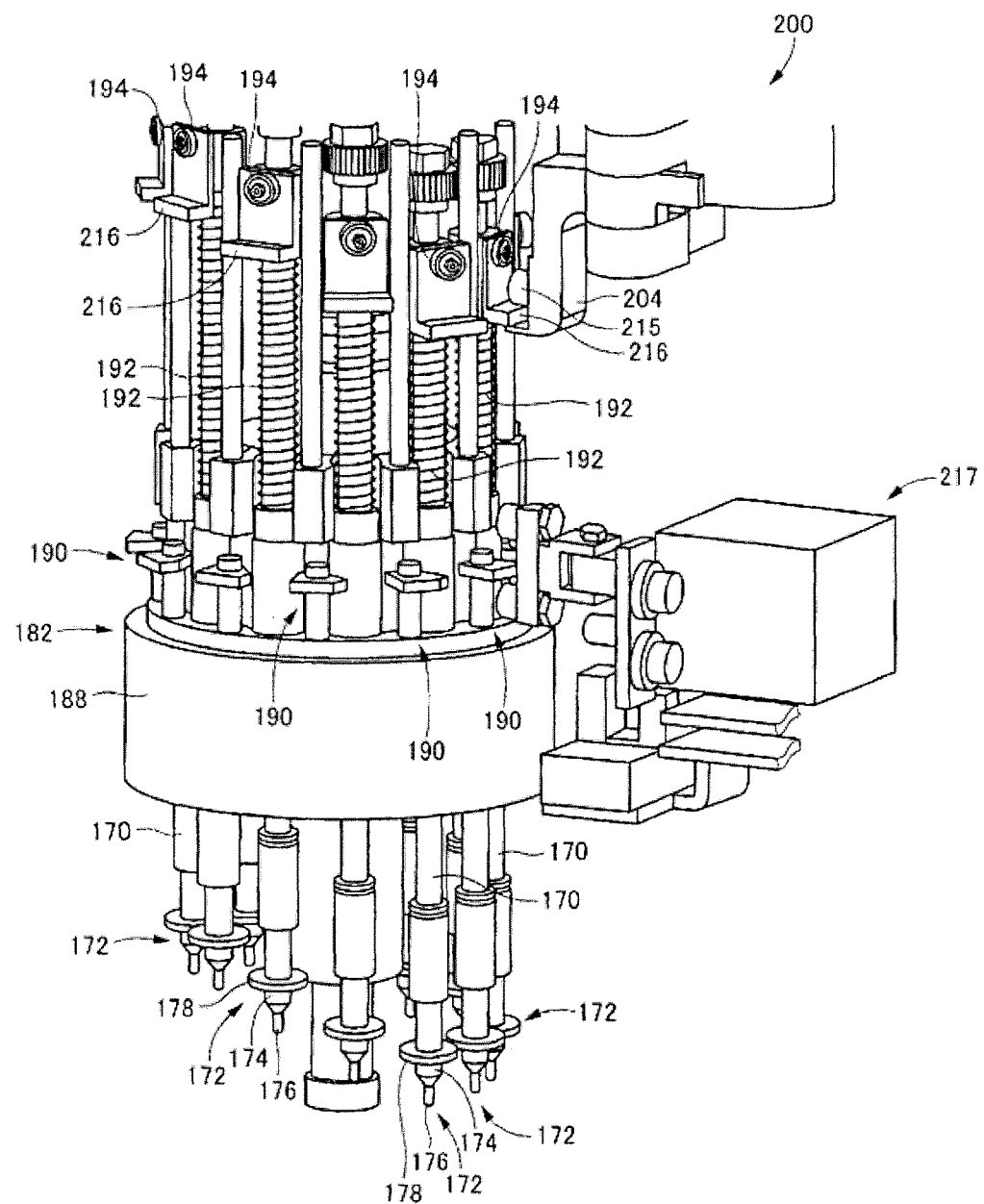

Suction nozzles 172, as shown in FIG. 5 of the present embodiment, are equipped with nozzle main body 174, pickup pipe 176 provided at one end of the axis direction of nozzle main body 174, and sheet-shaped background forming member 178; and negative pressure is supplied to pickup pipe 176 via a passage (omitted from figures) provided inside nozzle main body 174 such that a component is picked up. Background forming member 178 forms the background of the component when an image is captured by component imaging device 30 of a component held by suction nozzle 172.

As shown in FIG. 4, rotating body 182 is supported on head main body 160 such that it can be rotated about its own vertical axis line, and can be rotated to any angle in both forward and reverse directions about a vertical axis line by rotational driving device 186 which has electric motor 184 as its driving source. The twelve nozzle holders 170, are each engaged at twelve positions at suitably spaced intervals on the circumference centered around the rotational axis line of rotating body 182 of the outer section of holder holding section 188 of rotating body 182, which for the present embodiment is twelve positions spaced at equal angles, and can be moved relative to the axis direction and can be rotated about their own axis line in an orientation such that that axis direction is parallel to the rotational axis line of rotating body 182. Suction nozzles 172 are held by each of these nozzle holders 170, and positive pressure and negative pressure can be selectively supplied in the suction pipe 176 thereof by the switching of switching valve device 190 provided to correspond to each of the twelve nozzle holders 170.

The twelve suction nozzles 172 are rotated in a horizontal direction around the rotational axis line of rotating body 182 and stopped consecutively at twelve stopping positions by rotating body 182 being intermittently rotated at angles equal to the distribution angle interval of nozzle holders 170. Also, nozzle holder 170 is biased up by compression coil spring 192 (hereafter abbreviated to spring 192), and roller 194, which forms a cam follower which is provided on the upper section thereof, is moved along cam surface 198 of cam 196 fixedly provided on head main body 160. By this, suction nozzles 172 are raised and lowered while being rotated around the rotational axis line of rotating body 182.

Due to this, the separation in the height direction of suction nozzles 172 from board holding device 22 at the twelve stopping positions is not the same for all, and the stopping position for which that distance is the shortest is the component mounting position at which electronic circuit components are mounted on board 40, and the position 180 degrees separated from the component mounting position which is the high position for which that distance is the longest is the component imaging position; a stopping position in between this component mounting position and component imaging position is the component takeout position at which electronic circuit components are taken out from the bulk component supply device 24. When an electronic circuit component is taken out from tape feeder 50 by suction nozzle 172, the mounting of electronic circuit components removed from both a tape feeder 50 and bulk component supply device 24 onto board 40 is performed at the component mounting position, and the component mounting position is also the component takeout mounting position. In the present embodiment, rotating body 182 and rotational driving device 186 configure the nozzle rotating device which forms the component holding tool rotating device, and moves suction nozzles 172 with respect to head main body 160 in a direction which intersects a vertical direction which is the axis direction thereof, and configures the component holding tool moving device which moves suction nozzles relatively to the component takeout position and the component mounting position. It should be noted that compression coil spring 192 is a type of spring as an elastic member which is a type of biasing device. The same is also true for other coil springs described hereafter.

Figure 6:
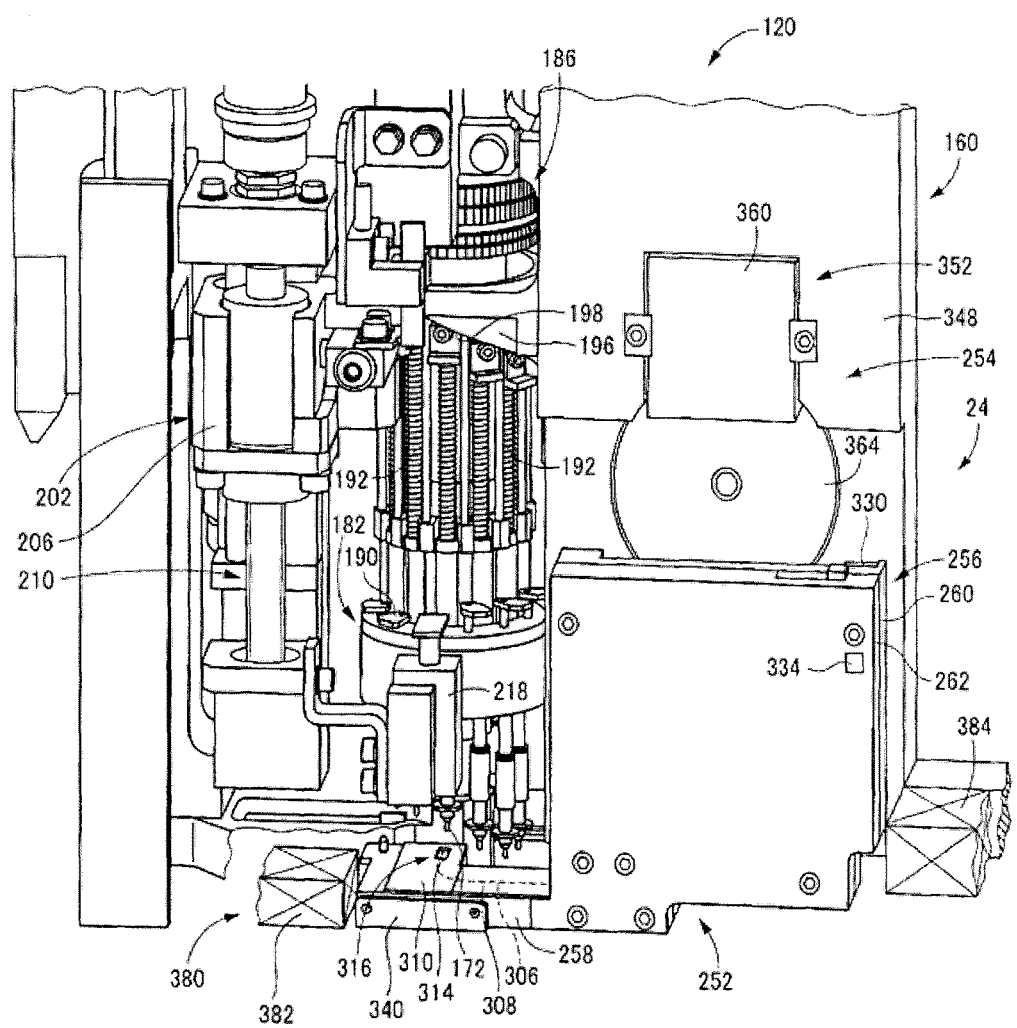
Figure 6:
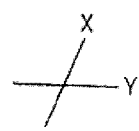

As shown in FIG. 5 and FIG. 6, provided respectively at the component mounting position and the component takeout position are raising/lowering devices 200 and 202 which configure a nozzle raising/lowering device which form the holding tool raising/lowering device, and which raise/lower nozzle holder 170 with respect to head main body 160 so as to raise/lower suction nozzle 172. Each of these raising/lowering devices 200 and 202 includes raising/lowering members 204 and 206, transfer screw mechanisms 208 and 210, and electric motors 212 and 214 (refer to FIG. 4). With the lowering of raising/lowering members 204 and 206, as shown by raising/lowering member 204 in FIG. 5, engaging member 215 which is configured from a roller, contacts the upper surface of sheet-shaped section to be engaged 216 provided on nozzle holder 170, pushes nozzle holder 170 against the biasing force of spring 192, and lowers suction nozzle 172. By the raising of raising/lowering member 204, raising of nozzle holder 170 by the biasing of spring 192 is allowed, and suction nozzle 172 rises. Raising/lowering devices 200 and 202 forcibly lower suction nozzle 172, but are devices configured to allow rising. For a raising/lowering device, a device may forcibly move suction nozzle 172 both when raising and lowering.

Also, as shown in FIG. 5 and FIG. 6, valve switching devices 217 and 218 are provided respectively at the component mounting position and the component takeout position, and switching is performed of the provided switching device 190 for suction nozzles 172 which perform component mounting and component takeout at the component mounting position and component takeout position respectively.

Figure 13:
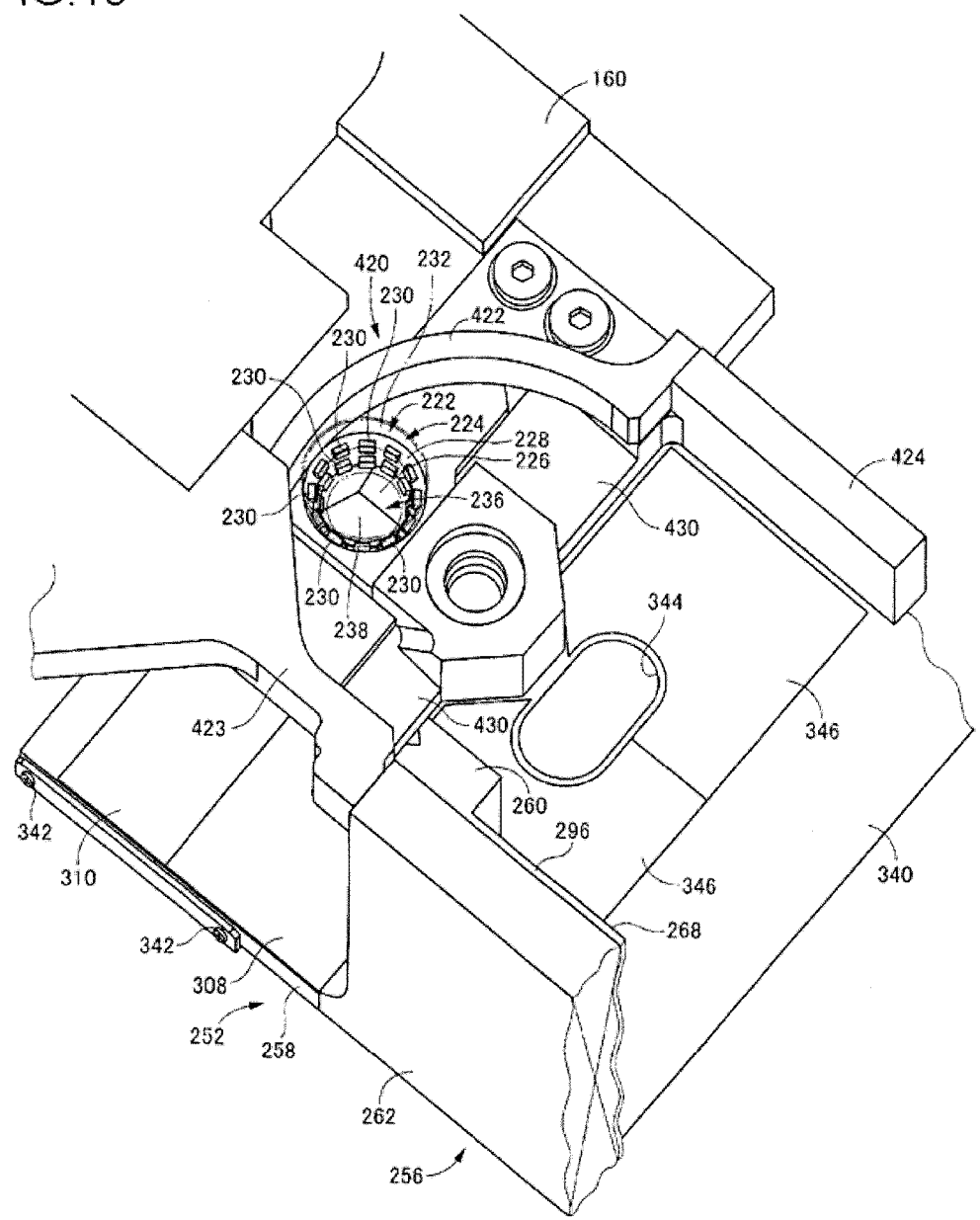

As shown in FIG. 4, at the section corresponding to the component imaging position of head main body 160, component imaging device 220 and lighting device 222 (refer to FIG. 13) are provided. As shown in FIG. 13, at the section of head main body 160 directly below suction nozzle 172 moved to the component imaging position, opening 224 which opens on the upper surface of head main body 160, and concavity 226 which opens on opening 224 and the lower surface of head main body 160, are formed.

Inner circumferential surface 228 of opening 224 has a tapered inner circumferential surface the diameter of which gradually decreases, and stored within is lighting device 222. Lighting device 222 includes multiple LEDs 230. These LEDs 230 are provided on the incline of inner circumferential surface 228, and as well as being lined up in a circle around a center line which includes the axis line of suction nozzle 172 stopped at the component imaging position, are attached in multiple rows in a direction parallel to the center line wherein the diameter of the circular rows becomes smaller the lower the row is, and shine light up.

Figure 14:
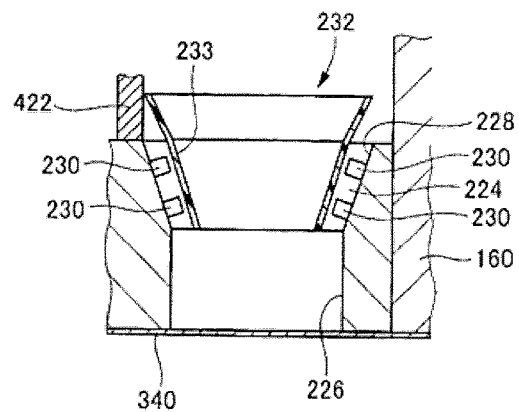

Multiple LEDs 230 are covered by cover 232. Cover 232 is formed in a cylindrical shape, and as shown in FIG. 14, is inclined to match LEDs 230, and the internal surface thereof is made of inclined surface 233 which is inclined in a direction separated further from the center line of inner circumferential surface 228 the higher it is. The upper end section of cover 232 protrudes above from the upper end of opening 224 and covers LEDs 230 from above. In the present embodiment, cover 232 is made from a synthetic resin, is transparent, and does not obstruct the light shining from LEDs 230.

Component imaging device 220 includes light-guiding device 236 (refer to FIG. 13) and CCD camera 234 (refer to FIG. 4) which form an imaging apparatus. CCD camera 234 is provided pointing downwards at a section on the outer side circumferentially of the rotational axis path of suction nozzles 172 of head main body 160; light-guiding device 236 includes multiple mirrors 238 (one is shown in FIG. 13) and is stored in the above concavity 226. Concavity 226 is provided in a state extending from below opening 224 to below CCD camera 234, and as shown in FIG. 13, one of the multiple mirrors 238 is provided below lighting device 242, and is positioned directly below suction nozzle 172 which is stopped at the component imaging position. The direction of the image forming light (light reflected from an electronic circuit component) reflected by this mirror 238 is changed by another mirror 238, and is shone into CCD camera 234 by a mirror 238 provided below CCD camera 234, such that an image is captured of the electronic circuit component being held by suction nozzle 172. A CMOS camera may be used instead of a CCD camera.

Further, as shown in FIG. 4, nozzle holder rotational driving device 244 is provided on head main body 160, and rotates nozzle holder 170 about its own axis. Nozzle holder rotational driving device 244 has electric motor 246 as a driving source and is a device which rotates all twelve nozzle holders 170 at the same time.

Figure 7:
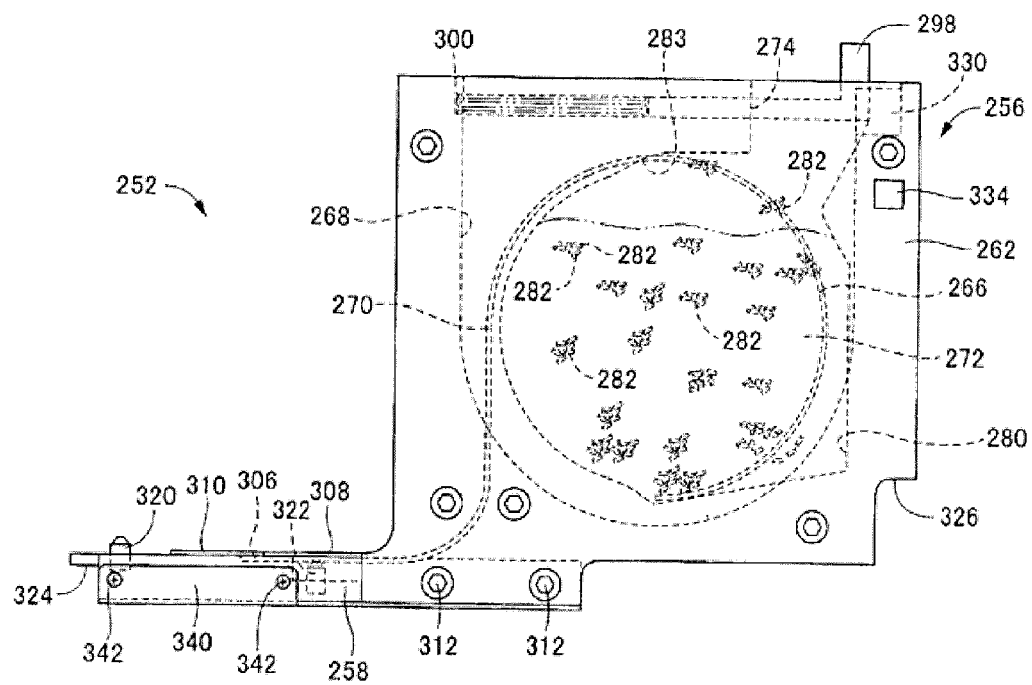

Described below is the above bulk component supply device 24. Bulk component supply device 24, as shown in FIG. 6, is provided with a section corresponding to the component takeout position of head main body 160. Bulk component supply device 24, is held on second X-axis slide 142 via head main body 160, is held on a movable member, and is moved with respect to board holding device 22 together with mounting head 120. This bulk component supply device 24 includes passage-equipped component case 252 and component driving device 254. As shown in FIG. 7, passage-equipped component case 252 includes component storage case 256 and guiding passage forming body 258 fixed to each other.

Figure 8:
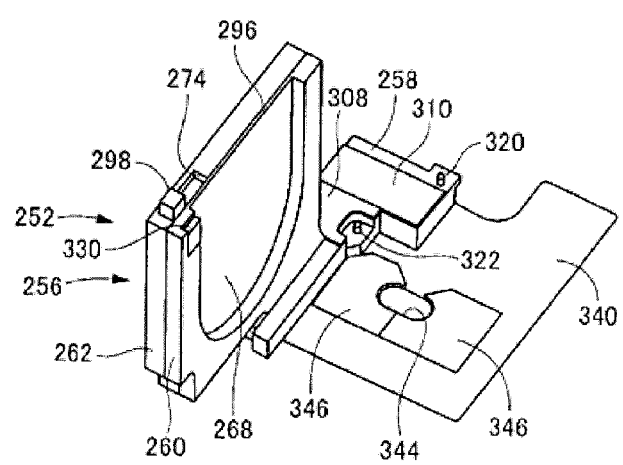

As shown in FIG. 7 and FIG. 8, component storage case 256 includes case members 260 and 262. Case members 260 and 262 are both formed as flat plates, and are facing and fixed to each other; the width of component storage case 256 is narrow and has a flat shape extending in a vertical plane. The width of component storage case 256 is the dimension in the horizontal direction of case members 260 and 262 lined up; the direction of the width of component storage case 256 is the direction of the width of passage-equipped component case 252 and bulk component supply device 24. As shown in FIG. 7, guiding groove 266, concavity 268, guiding passage 270, storage chamber 272, and component inlet 274 are provided on component storage case 256. Storage chamber 272 is formed by case member 260 covering concavity 280 formed in case member 262. The sections forming storage chamber 272 which extend parallel to the Y-axis direction of case members 260 and 262 each configure a main wall extending vertically. Many components 282 are stored in a loosely packed state as bulk components in storage chamber 272. As component 282, leadless electronic circuit components which do not have leads are stored, for example, capacitors and resistors and the like, and components which have electrodes made from magnetic material (chip components) are stored. Also, in the present embodiment, case member 262 is made from transparent material and the entire body is transparent.

Guiding groove 266 is formed in a partial annular shape, is formed to open onto the surface filling concavity 280 of case member 260, and opens into storage chamber 272. Guiding passage 270 is formed by the covering of the section which demarcates concavity 280 of case member 262 by the vertical groove and partial annular groove formed continuing from guiding passage 266 in case member 260. At the boundary section between guiding groove 266 and guiding passage 270 which is at the upper section storage chamber 272, drop-off section 283 is formed.

As shown in FIG. 8, concavity 268 is formed opening between upper the surface and outside surface which is the opposite surface to the surface of case member 260 which faces case member 262. Storage chamber 272 and concavity 268 are divided by bottom wall section 296 of concavity 268. Component inlet 274 is provided at the upper section of case member 262, and components 282 enter through into storage chamber 272. Component inlet 274 opens and closes using shutter 298 which forms an opening/closing member. Shutter 298 is biased in the closed direction of component inlet 274 by compression coil spring 300 (refer to FIG. 7).

The above guiding passage forming body 258, as shown in FIG. 7 and FIG. 8, is formed in a block shape such that guiding passage 306 is formed. Guiding passage 306 is formed by the opening of the groove formed opening on the upper surface of guiding passage forming body 258 being covered by covers 308 and 310, and configures a horizontal guiding passage section which extends in a horizontal plane. In the present embodiment, covers 308 and 310 are made from transparent material and the entire body is transparent; and after being fixed to guiding passage forming body 258 functions as part of guiding passage forming body 258. Component storage case 256 is detachably fixed to guiding passage forming body 258 by multiple bolts 312 which are a kind of fixing means, and after being fixed acts as an integrated passage-equipped component case 252. Guiding passage 306 is formed continuing from guiding passage 270, and as shown in FIG. 6, in a state in which passage-equipped component case 252 is held on mounting head 120, the front end thereof has a shape which goes below suction nozzle 172 stopped at the component takeout position. Opening 314 is provided in the section corresponding to the front end of guiding passage 306 of cover 310 such that takeout of components 282 is allowed, and the section including that opening 314 configures component supply section 316.

Figure 9:
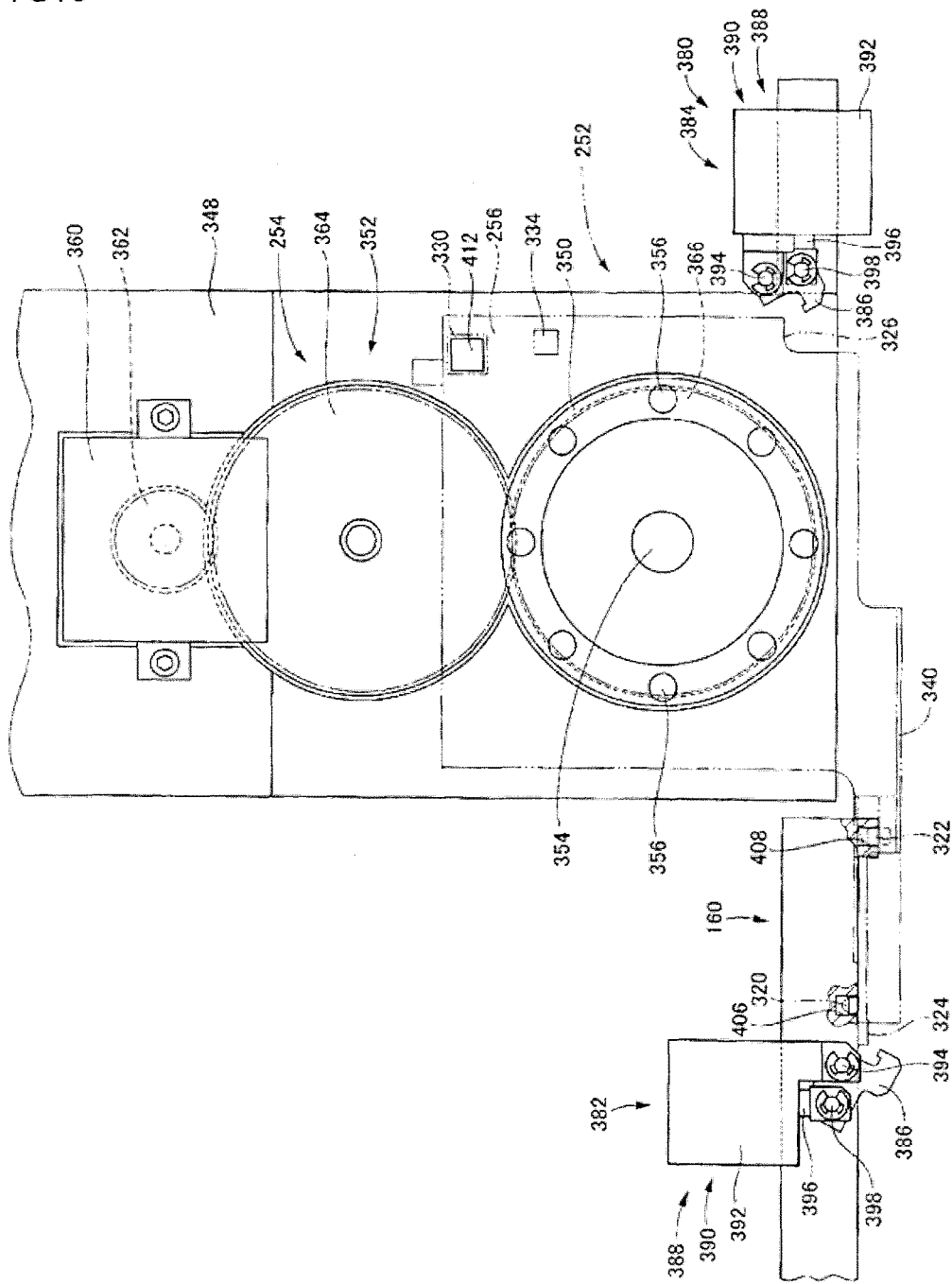

In the present bulk component supply device 24, passage-equipped component case 252 can be attached/detached to/from head main body 160. Therefore, as shown in FIG. 9, multiple, in the present embodiment, two positioning pins 320 and 322, are provided protruding on guiding passage forming body 258. Positioning pins 320 and 322 are positioned differently in the X-axis direction and the Y-axis direction, and configure an installation positioning section provided parallel to the vertical direction. Also on passage-equipped component case 252, downward facing engaging surfaces 324 and 326 are formed respectively in guiding passage forming body 258 and case member 262 which are two locations separated in the Y-axis direction, such as to configure a section to be engaged.

Figure 10:
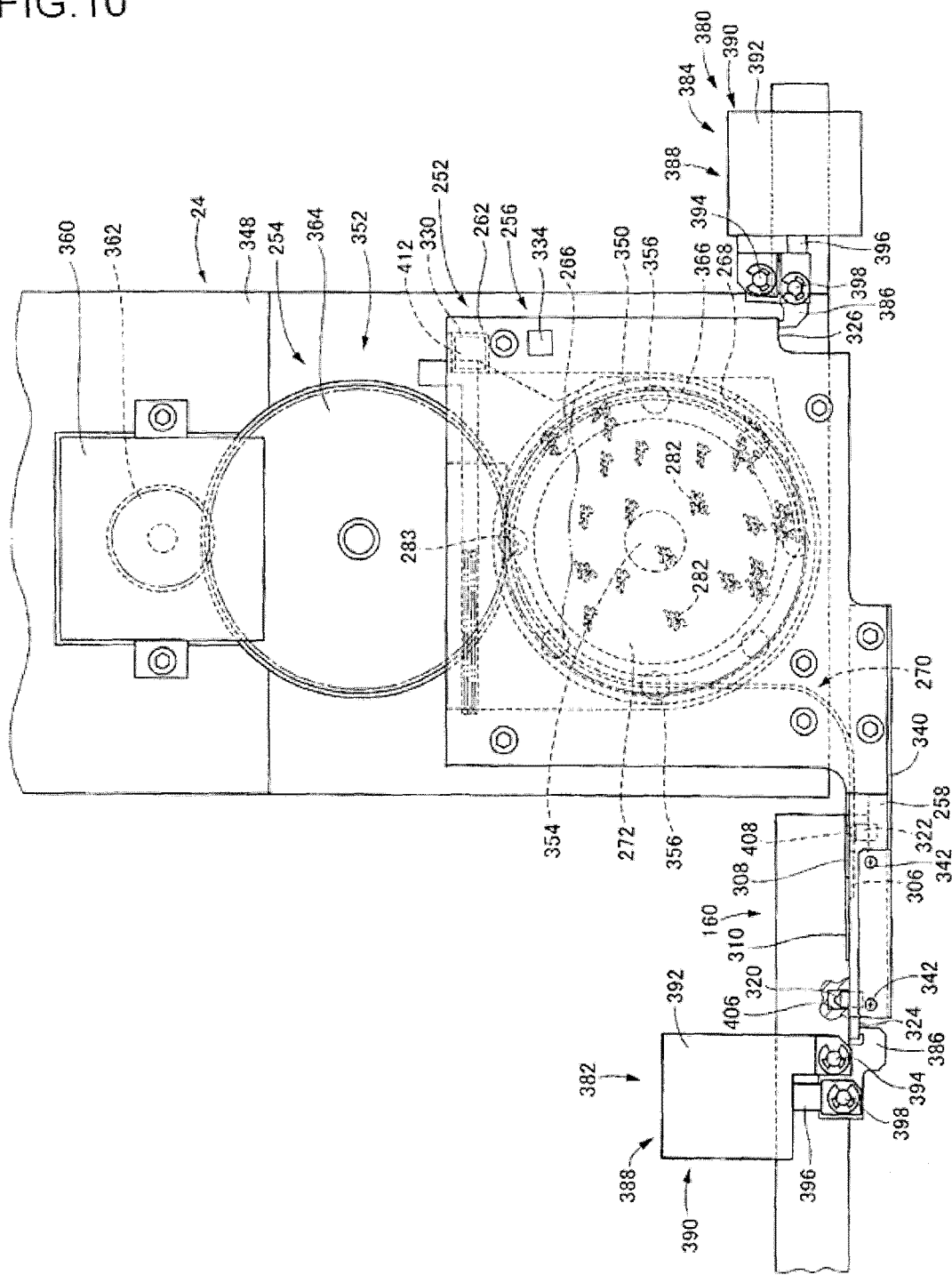

Further, as shown in FIG. 8, on passage-equipped component case 252, RFID tag 330 of an RFID (Radio Frequency Identification) system is provided on the opposite surface to the surface of case member 260 which faces case member 262, configuring an information memorizing section. RFID tag 330 is equipped with a communication section and a memory section, and the information memorized in the memorizing section can be rewritten. Also, as shown in FIG. 10, two-dimensional code 334 is provided in the surface on the opposite side to the surface of case member 262 which faces case member 260, and, for example, an identification number which forms identity information for identifying the type of component storage case 256 and the individual component storage case 256 is memorized. The type of component storage case 256 is different based on, for example, the size of guiding groove 266 and guiding passage 270, and the type of the stored components. Component storage case 256 configures passage-equipped component case 252; the identification information and type of component storage case 256 are the identification information and type of passage-equipped component case 252.

As shown in FIG. 8, dropped component catch plate 340, which forms a dropped component catch member which catches dropped components which are electronic circuit components that have dropped from suction nozzle 172, is attached to passage-equipped component case 252. Dropped component catch plate 340 is thin and detachably fixed to passage-equipped component case 252 by bolts 342 in a state contacting the lower surface of component storage case 256 and guiding passage forming body 258 as shown in FIG. 11 and FIG. 12, and is extended out horizontally to the opposite side of case member 262 from the case member 260 side.

Figure 11:
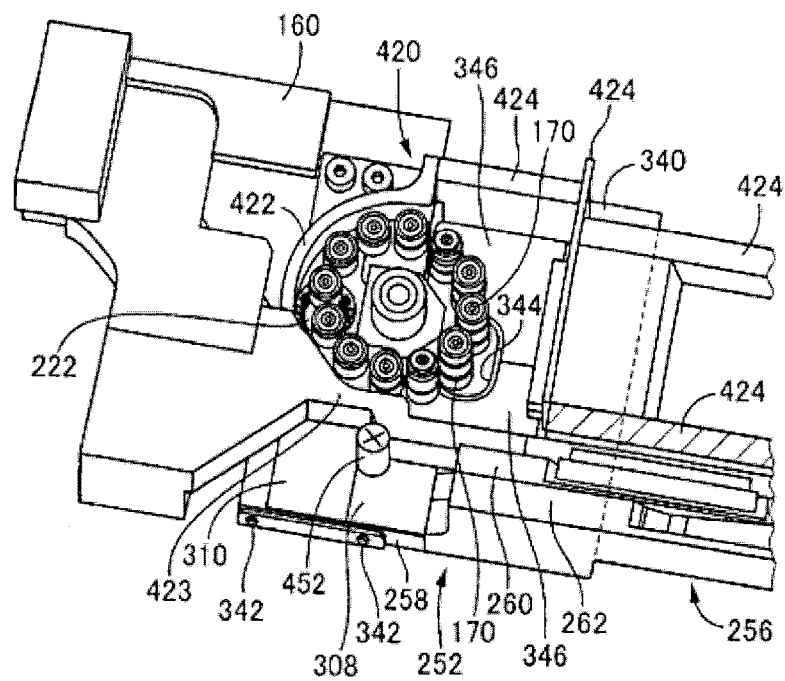
Figure 12:
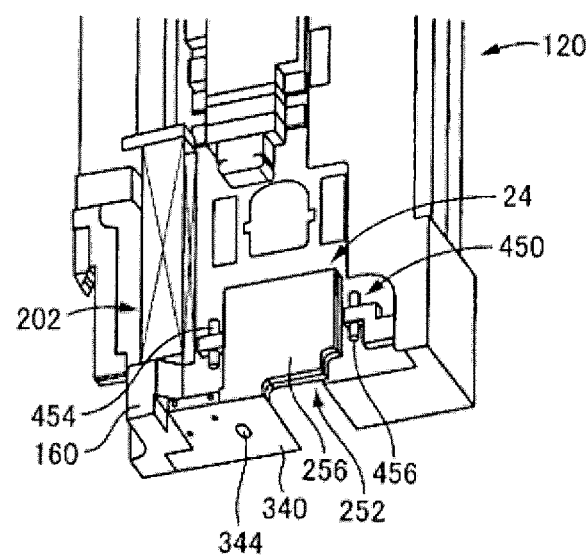

As shown in FIG. 11 and FIG. 13, dropped component catch plate 340 is extended out horizontally from passage-equipped component case 252 to rotating body 182 in a state in which passage-equipped component case 252 is held on head main body 160, and is positioned below the rotational axis path of suction nozzle 172, and below lighting device 222 and light-guiding device 236. Dropped component catch plate 340 also directly contacts the lower surface of head main body 160 and covers the opening to the lower surface of head main body 160 of the concavity 226. Opening 344 is formed penetrating vertically in the section corresponding to the component mounting position of dropped component catch plate 340. Opening 344 allows the passing of a suction nozzle 172 which is holding a component. In particular, this suction nozzle 172 is equipped with background forming member 178, and opening 344 has a width and length to allow the passing of background forming member 178. The length is the dimension in a horizontal direction in a tangential line at the component mounting position of the rotational axis path of suction nozzle 172; the width is the dimension in a direction orthogonal to the length direction in a horizontal plane which is a plane perpendicular to the axis line of suction nozzle 172. Also, in the present mounting device 26, suction nozzle 172 is raised/lowered while being rotated during each of component takeout and component mounting. Therefore, opening 344 is long, such that interference is avoided between dropped component catch plate 340 and suction nozzle 172 which is raised/lowered before/after the component mounting position.

It should be noted that, if a suction nozzle does not have a background forming member, the width of the opening may be smaller than in the case in which the suction nozzle has a background forming member, and may be of a size which allows the passing of the nozzle main body. Also, if the nozzle rotation and raising/lowering are not performed at the same time and raising/lowering is performed with the suction nozzle stopped at the component mounting position, the opening may be of a length which allows the raising/lowering of the suction nozzle at the component mounting position.

As shown in FIG. 8, sheet 346 manufactured from silicone is attached on the upper surface of dropped component catch plate 340, and forms a relative movement curtailment layer. In the present embodiment, sheet 346 is open above dropped component catch plate 340 in a state in which passage-equipped component case 252 is held on head main body 160, is attached such as to cover the entire exposed section, and is also attached to the section surrounding the periphery of opening 344.

The component driving device 254, as shown in FIG. 9, includes rotating disk 350 and rotating disk driving device 352, and is provided on vertical supporting wall 348 which configures head main body 160. Rotating disk 350 is formed in a disk shape and is attached rotatably around an axis line parallel to the X-axis direction to supporting wall 348 by axis 354. On the side of rotating disk 350, multiple, for example, three or more, in the present embodiment eight, permanent magnets 356 which form magnets, are held on the circumference centered around the rotational axis line the side of rotating disk 350 separated by suitably spaced intervals, which in the present embodiment are equal angle intervals. Rotating disk driving device 352 has as a driving source electric motor 360 provided above rotating disk 350, and the rotation thereof is transmitted via gears 362 and 364 to gear 366 fixed concentrically to rotating disk 350, such that rotating disk 350 can be rotated in both the forward and reverse directions to any angle. Gears 362, 364, and 366 are arranged vertically and positioned in the same vertical plane. Also, electric motor 360 and rotating disk 350 are thin and the entire body of component driving device 254 has a width with a narrow flat shape extending in a vertical plane.

In a state in which passage-equipped component case 252 is attached to head main body 160, as shown in FIG. 10, rotating disk 350 is engaged in concavity 268 of case member 260, and the state is such that the center of a circle defined by the arc of guiding groove 266 matches the rotational axis line of rotating disk 350. Due to this, in accordance with permanent magnets 356 being rotated by the rotation of rotating disk 350, as well as components 282 inside storage chamber 272 being picked up and moved from down to up by permanent magnets 356 via bottom wall section 296 of concavity 268, a portion of components 282 are fitted into guiding groove 266, and enter into guiding passage 270 from guiding groove 266. However, it is not the case that all of the components 282 moved in accordance with the rotation of permanent magnets 356 can be fitted into guiding groove 266, and components 282 which are moved to near the boundary between guiding groove 266 and guiding passage 270 without being fitted into guiding groove 266 are dropped off by drop-off section 283 and fall into storage chamber 272. Meanwhile, components 282 which entered into guiding passage 270 soon enter into guiding passage 306, and are guided to component supply section 316 in a state arranged in a line. Although omitted from the figures, the air inside guiding passage 306 is sucked by an air suction device through an air passage formed inside guiding passage forming body 258 to aid the movement of component 282 to component supply section 316. It should be noted that electromagnets may be used instead of permanent magnets.

As shown in FIG. 9, passage-equipped component case attachment device 380 which forms a detachable section holding device is provided on head main body 160. Passage-equipped component case attachment device 380, in this embodiment, includes pair of clamping devices 382 and 384. Clamping devices 382 and 384 are provided spaced out in the Y-axis direction. One of the clamping devices 382 includes clamping claw 386 which forms a holding member and clamping claw driving device 388 which forms a holding member driving device.

Air cylinder 390 which forms the driving source of clamping claw driving device 388 is fixed to head main body 180 at the cylinder housing 392 thereof; clamping claw 386 is attached to cylinder housing 392 rotatably around an axis line parallel to the X-axis direction by axis 394. Clamping claw 386 is also connected to piston rod 396 of air cylinder 390 by axis 398. Axis 398, as well as being inserted through an elongated hole (omitted from figures) formed in clamping claw 386, is supported both ends by piston rod 396, and clamping claw 386 is rotatably connected to piston rod 396. Clamping claw 386 is, by the expansion/contraction of piston rod 396, rotated around an axis line of axis 394 and: moved to a clamp position in which clamping claw 386 engages with engaging surface 324 and holds passage-equipped component case 252 from below, as shown in FIG. 10; and clamping claw 386 is moved to an unclamp position in which clamping claw 376 separates from engaging surface 324, and as well as releasing passage-equipped component case 252, is retracted outside or to the side from the space under passage-equipped component case 252, as shown in FIG. 9. The flank with respect to component storage case 256 includes component storage case 256 and is the direction separated in the horizontal direction from component storage case 256 in a vertical plane parallel to the Y-axis direction.

Clamping device 384 is configured in the same way to clamping device 382 and corresponding relationships are indicated by the same reference signs being attached to the configuration elements which have the same effects, so descriptions are omitted. It should be noted that, based on the state of the space on head main body 160, on the present mounting head 120, air cylinder 390 of clamping device 382 is provided vertically, and air cylinder 390 of clamping device 384 is provided horizontally.

Also, clamp sensors 400 and 402 (refer to FIG. 21) are provided on head main body 160. In the present embodiment, clamp sensors 400 and 402 are configured from a reflection type photoelectric sensor which forms a photoelectric sensor which is a type of non-contact sensor, and are provided such that light hits the end section (the section which engages with engaging surfaces 324 and 326) of clamping claw 386 in a state positioned in the clamp position, from a direction parallel to the rotational axis line of clamping claw 386. Clamp sensors 400 and 402, in a state in which clamping claw 386 is positioned at the clamp position, output an on signal when the light receiving section receives light; and in a state in which clamping claw 386 is positioned at the unclamp position, clamping claw 386 is outside the light path, so the light receiving section does not receive light and an off signal is outputted. Clamp sensors 400 and 402 configure clamping device state detection devices which form detachable section holding device state detection devices.

Also on head main body 160, as shown in FIG. 9, two positioning holes 406 and 408 are formed opening on the lower surface of head main body 160 and configure a positioning section. A positioning protruding section may be provided on the head main body 160 side, and a positioning concavity may be provided on the passage-equipped component case side.

When passage-equipped component case 252 is attached to head main body 160, clamping claw 386 is positioned at the unclamp position, passage-equipped component case 252 is moved up from a position under head main body 160, positioning pins 320 and 322 are engaged with positioning holes 406 and 408 of head main body 160, and passage-equipped component case 252 is positioned horizontally with respect to head main body 160. Also, rotating disk 350 is fitted into concavity 268. In that state, each clamping claw 386 of clamping devices 382 and 384 is rotated to the clamp position, and engaged from below with engaging surfaces 324 and 326. By this, the upper surface of guiding passage forming body 258 is contacted against the lower surface of head main body 160, and passage-equipped component case 252 is positioned vertically and held with respect to head main body 160. Component storage case 256 of passage-equipped component case 252 is flat, and component driving device 254 is also flat. It follows that the width of the entire body of bulk component supply device 24 is relatively small compared to the height, and it has a flat shape.

When removing passage-equipped component case 252 from head main body 160, clamping claw 386 is rotated to the unclamp position, and holding by clamping devices 382 and 384 is released. Then, by moving passage-equipped component case 252 down with respect to head main body 160, positioning pins 320 and 322 are removed from positioning holes 406 and 408. Also, rotating disk 350 is removed from concavity 268 and passage-equipped component case 252 is removed from head main body 160 with all of component driving device 254 remaining on head main body 160 and in a state held as is on mounting head 120. In the present embodiment, storage chamber 272 of component storage case 256 configures a component storage section; the section provided on which is provided guiding passage 270 of component storage case 256, and guiding passage forming body 258, configure a guiding passage forming section; passage-equipped component case 252 configures a detachable section; and the section including the guiding passage forming section and component storage section of bulk component supply device 24 is attached/detached in the vertical direction to/from head main body 160 in a space below head main body 160. This means RFID tag 330 provided on case member 260 is provided on the detachable section. Because component driving device 254 equipped with a driving source remains on head main body 160, and passage-equipped component case 252 configuring a detachable section is not equipped with an actuator, when attaching/detaching to/from head main body 160, no consideration needs to be given to the connection and disconnection of electric power wires and communication wires, and attaching/detaching is easy. Also, component driving device 254 is shared for multiple passage-equipped component cases 252, so the device cost can be low.

Figure 15:
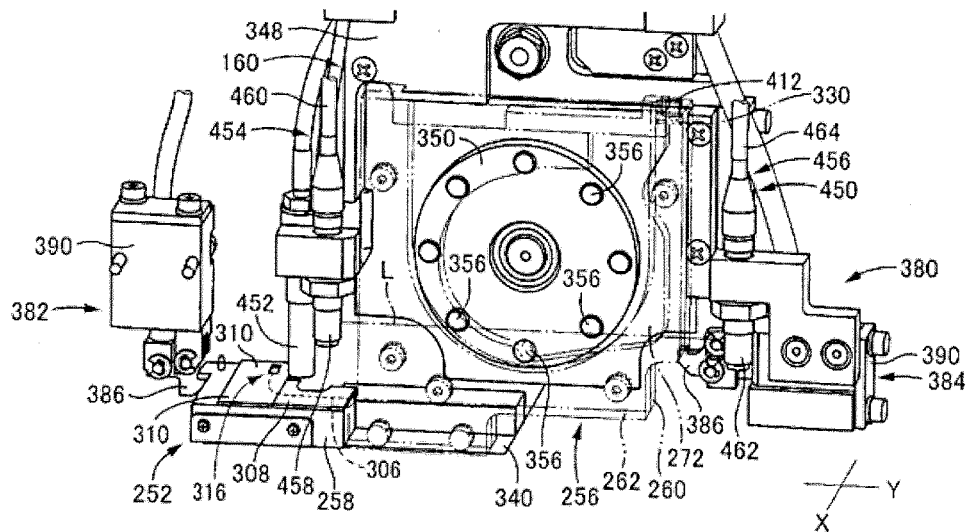

RFID reader-writer 410 (refer to FIG. 21) is provided on head main body 160. RFID reader-writer 410, as shown in FIG. 15, is equipped with separated type antenna 412, and that antenna 412 is fixed to supporting wall 348 of head main body 160, and is connected to the main body section of RFID reader-writer 410 by a connector and cord (omitted from figures). RFID reader-writer 410 is connected to module control computer 106 by attachment to second X-axis slide 142 of mounting head 120. Antenna 412, with passage-equipped component case 252 in a state attached to head main body 160 as above, is provided in a position facing RFID tag 330, such that RFID tag 330 of passage-equipped component case 252 can perform communication with RFID reader-writer 410 via antenna 412. RFID reader-writer 410 reads information memorized in the memorizing section of RFID tag 330 via antenna 412, can write information, and in the present disclosure configures an information reading section and an information writing section.

Further, as shown in FIG. 11, dropped component prevention section 420 is provided on head main body 160. In the present embodiment, dropped component prevention section 420 includes walls 422 and 423 provided on the outside of the rotational axis path of suction nozzle 172 and vertically in a state enclosing that rotational axis path. Wall 422 is a partial cylinder. Also, multiple attachment sections 424 for attaching the various configuring members of mounting head 120 are provided on head main body 160, and within those attachment sections 424, an attachment section 424 positioned on the outside of the rotational axis path of suction nozzle 172 and positioned above the dropped component catch plate 340, configures dropped component prevention section 420. Further, as shown in FIG. 13, the upward facing surface positioned below the rotational axis path of suction nozzle 172 of head main body 160, is a guiding surface or inclined surface 430 which is inclined in a direction facing down to the dropped component catch plate 340 side.

As shown in FIG. 15, storage-section-use component sensor 450 and guiding-passage-use component sensor 452 are provided on head main body 160. Head main body 160 is detachably attached to second X-axis slide 142, but sensors 450 and 452 which are not attached/detached to/from second X-axis slide 142 during attachment/detachment of passage-equipped component case 252, and which remain attached as is, are attached to a section which is not attached/detached together with the detachable section. In the present embodiment, storage-section-use component sensor 450 is configured from a transmission type photoelectric sensor which forms a photoelectric sensor which is a type of non-contact sensor, and includes projector 454 and receiver 456. In the present embodiment, the transmission type photoelectric sensor is configured from a fiber sensor;

projector 454 includes light projecting section 458 and fiber cable 460; receiver 456 includes light receiving section 462 and fiber cable 464.

Projector 454 and receiver 456 are provided spaced out in the Y-axis direction sandwiching case member 262 of component storage case 256, and are positioned to the side of component storage case 256 in a state in which passage-equipped component case 252 is attached to head main body 160. Also, light projecting section 458 and light receiving section 462 are provided in a position corresponding to storage chamber 272 in the X-axis direction, and the center of the light path L, as shown by the dashed line in FIG. 15, passes between both main walls of passage-equipped component case 252 configured from case members 260 and 262 parallel to both those main walls. Because base member 262 is transparent, light projected from light projecting section 458 passes through case member 262 and can be received by light receiving section 462.

Figure 16:
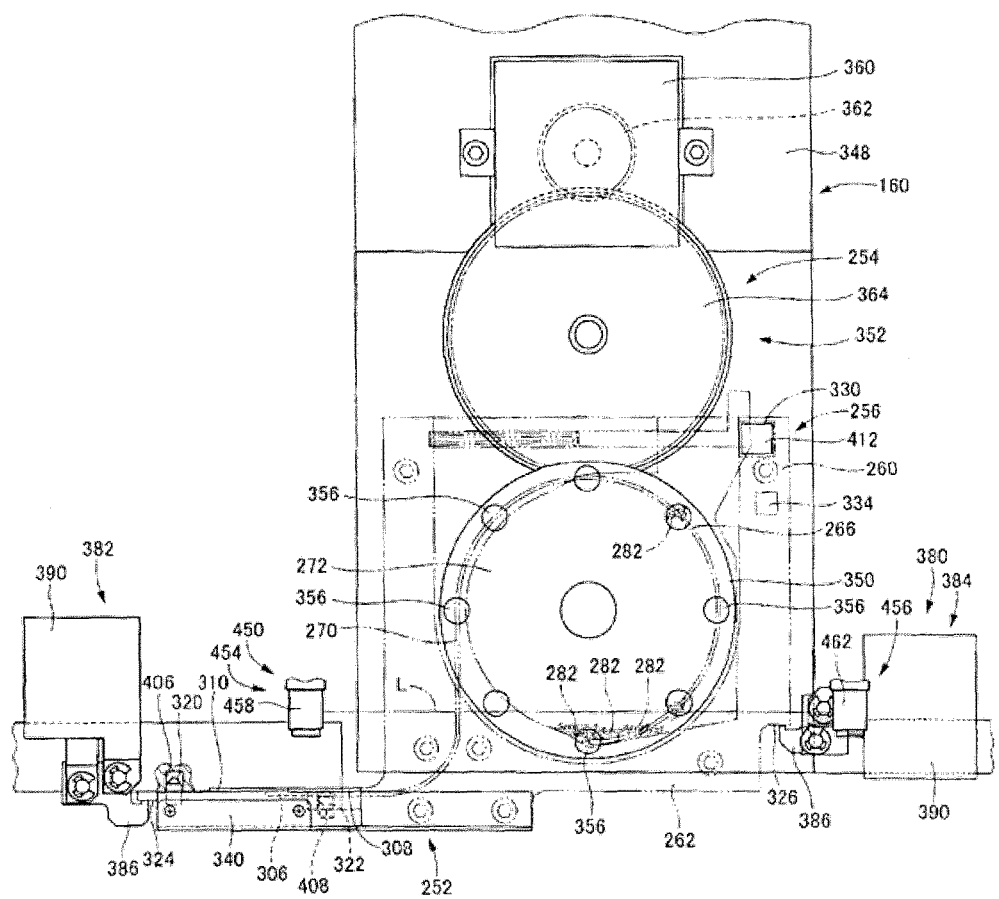

Further, as shown in FIG. 16, light projecting section 458 and light receiving section 462 are provided on a section corresponding to the lower end of storage chamber 272 in the vertical direction. In the present embodiment, rotating disk 350 transfers components 282 rotated by an integral multiple angle of the distribution angle interval of the eight permanent magnets 356 to guiding passage 270, and the stopping position thereof is the position at which, from the eight permanent magnets 356 of rotating disk 350 which is in a stopped state, the one of the multiple permanent magnets 356 positioned at the lowest position of the positions in which the entire body corresponds to storage chamber 272, is positioned at a position which corresponds to light projecting section 458 and light receiving section 462 in the vertical direction.

Storage-section-use component sensor 450 is configured such that: in a state in which the specified amount or greater of components 282 are stored and in which components 282 are stored in storage chamber 272 to exceed the light path L, light projected from light projecting section 460 is blocked by components 282 and is not received by light receiving section 462, in other words, in a state in which the amount of received light is smaller than a set received light amount, an on signal is outputted; and if the number of components 282 decreases and becomes smaller than the set amount, and the received light amount of light receiving section 462 becomes at least as large as the set received light amount, an off signal is outputted.

If follows that, if the amount of stored components 282 becomes smaller than the set amount, an off signal is outputted, but in a state in which components 282 remain inside storage chamber 272, they are picked up by permanent magnets 356 during the rotation of rotating disk 350 and moved up towards guiding passage 270. Because the stopping position of rotating disk 350 is a position at which permanent magnet 356 corresponds to light projecting section 458 and light receiving section 462 of storage-section-use component sensor 450 in the vertical direction, at least during the time that rotating disk 350 is stopped, components 282 picked up by permanent magnets 356 block the received light of receiving section 462 so that an on signal is issued, and until a state in which it can be considered that there are no components 282 in storage chamber 272, even for the final few, while light from light projecting section 460 towards light receiving section 462 is blocked by that few, a component 282 will be detected. If those few components 282 picked up by permanent magnets 356 are outside of the light path, an off signal is issued, but if a few components 282 are again in a state positioned in the light path, an on signal is issued. It follows that, after the amount of stored components 282 becomes small, until it can be considered that there are no components, on signals and off signals are issued alternately. Therefore, in the present embodiment, while a set quantity of component takeout operations are being performed by suction nozzle 172, in cases in which an off signal is issued consecutively while rotating disk 350 is in a stopped state, it can be considered that there are no components 282 in storage chamber 272. In a state in which the final few components 282 are dropped off by drop-off section 283, picked up again by permanent magnets 356 and positioned on the light path, while a quantity of components 282 remains for which the received light amount of light receiving section 462 is smaller than the set amount and the detection signal is an on signal, components 282 are considered not to have run out in storage chamber 272; if the quantity of components 282 decreases until the received light amount of light receiving section 462 becomes larger than the set amount and detection signal becomes an off signal, components 282 are considered to have run out in storage chamber 272.

Figure 17:
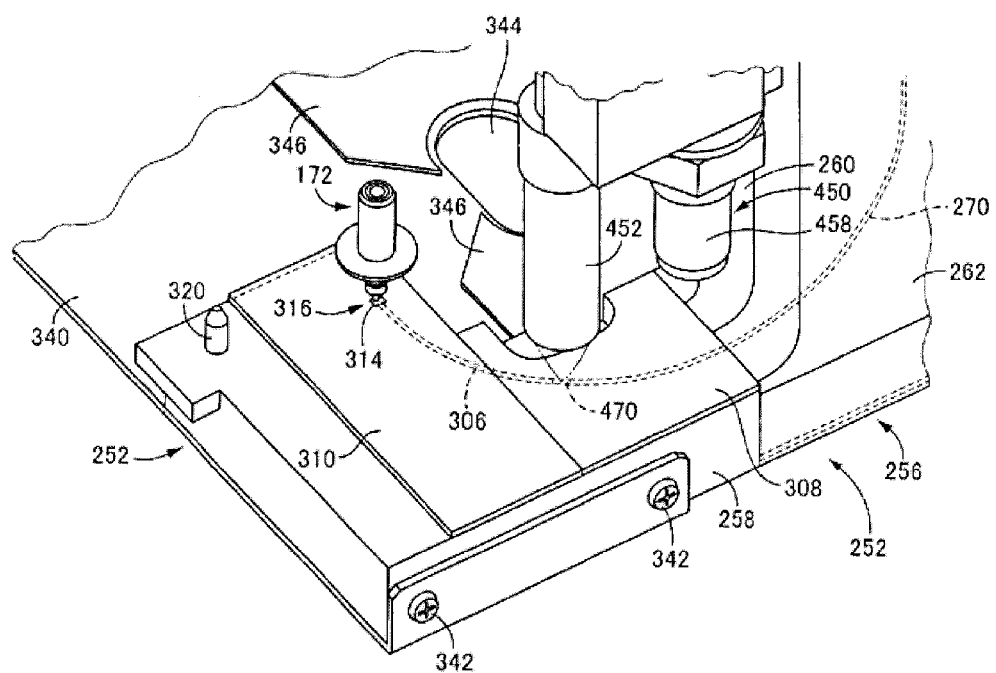

In the present embodiment, guiding-passage-use component sensor 452 is configured from a reflective type photoelectric sensor which forms a photoelectric sensor which is a type of non-contact sensor. Guiding-passage-use component sensor 452 is equipped with a light projecting section and a light receiving section, and as shown in FIG. 17, in a state positioned in a space above guiding passage 306, is provided in a predetermined position of guiding passage 306, in the present embodiment, a component detection position which is set in an intermediate position between guiding passage 270 of guiding passage 306 and component supply section 316. The surface of components 282 has high reflectance, and a non-reflective section 470 with low reflectance on which blackening has been performed is provided on the bottom surface of the component detection position of guiding passage 306. Non-reflective section 470 is provided on the lower end of a vertical light path which intersects guiding passage 306 vertically, and the light projecting section of guiding-passage-use component sensor is provided facing down and projects the light towards non-reflective section 470. It follows that, if a component is positioned at non-reflective section 470, the amount of light reflected from component 282 is large, the received light amount of light receiving section provided together with the light projecting section is larger than the set amount, an on signal is outputted, and component 282 is detected. If there is no component 282, the amount of light reflected is small, the received light amount of the light receiving section is small, an off signal is outputted, and that there is no component 282 is detected.

For multiple components 282 which are transferred arranged in a line in guiding passage 306, there are cases in which a gap arises between adjacent components 282, and although there are components 282 in guiding passage 306, they are out of non-reflective section 470, so an off signal is outputted. However, even if the detection signal of guiding-passage-use component sensor 452 becomes an off signal, if the detection signal of storage-section-use component sensor 450 is an on signal, components 282 upstream from the component detection position of guiding passage 306 are not treated as having run out. This is because components 282 run out in storage chamber 272 before guiding passage 306. And, in the present embodiment, after a state in which it can be considered that components 282 have run out in storage chamber 272 based on the detection signal of storage-section-use component sensor 450; in cases in which an off signal is outputted continuously while suction nozzle 172 component takeout operation is being performed the set number of times in a state in which the detection signal of guiding-passage-use component sensor 452 is an off signal, components 282 are taken to have run out at the component storage case 256 side section from non-reflective section 470 of guiding passage 306.

Guiding-passage-use component sensors may be provided on a section corresponding to component supply section 316 of head main body 160. However, because at component supply section 316 suction nozzle 172 is raised/lowered for component takeout, providing a guiding-passage-use component sensor is not easy. Conversely, the area around the intermediate section between guiding passage 270 of guiding passage 306 and component supply section 316 is open, and providing guiding-passage-use component sensor 452 is easy.

In this way, storage-section-use component sensor 450 is provided in a position positioned to the side of passage-equipped component case 252 which is in a state attached to head main body 160; and guiding-passage-use component sensor 452 is provided above guiding passage forming body 258; such that they are provided in a position separated from the vertical movement axis path when passage-equipped component case 252 is attached/detached to/from head main body 160. Due to this, when passage-equipped component case 252 is attached/detached, sensors 450 and 452 do not interfere with passage-equipped component case 252. It should be noted that component sensors 450 and 452 are omitted from FIG. 9 and FIG. 10 and so on.

Bulk component supply device 24 has a flat shape extending along the vertical surface, and little equipping space is required in the widthwise direction on mounting head 120, and in that narrow space storage-section-use component sensor 450 and guiding-passage-use component sensor 452 are provided, so it is not necessary to maintain component sensor arrangement space in addition to arrangement space for bulk component supply device 24, and mounting head 120 can be prevented from having to be made larger. In particular, because storage-section-use component sensor 450 is configured from a fiber sensor, light projecting section 458 and light receiving section 462 are small, and the degree of freedom for running fiber cables 460 and 464 is high; arrangement is easy, and appropriate for providing inside the narrow width of case member 262 which configures storage chamber 272. It should be noted that, as a non-contact sensor, instead of a photoelectric sensor, for example, a proximity sensor can be used.

Further, mounting head control device 480 (refer to FIG. 21) is provided on head main body 160. Mounting head control device 480 is configured from mounting head control computer 482 as the main part, is connected to module control computer 106, and controls, among other things, electric motor 184 configured from a servo motor with an encoder. Each encoder 484 for electric motor 184 and so on which is shown as one representative example is connected to mounting head control computer 482.

Figure 18:
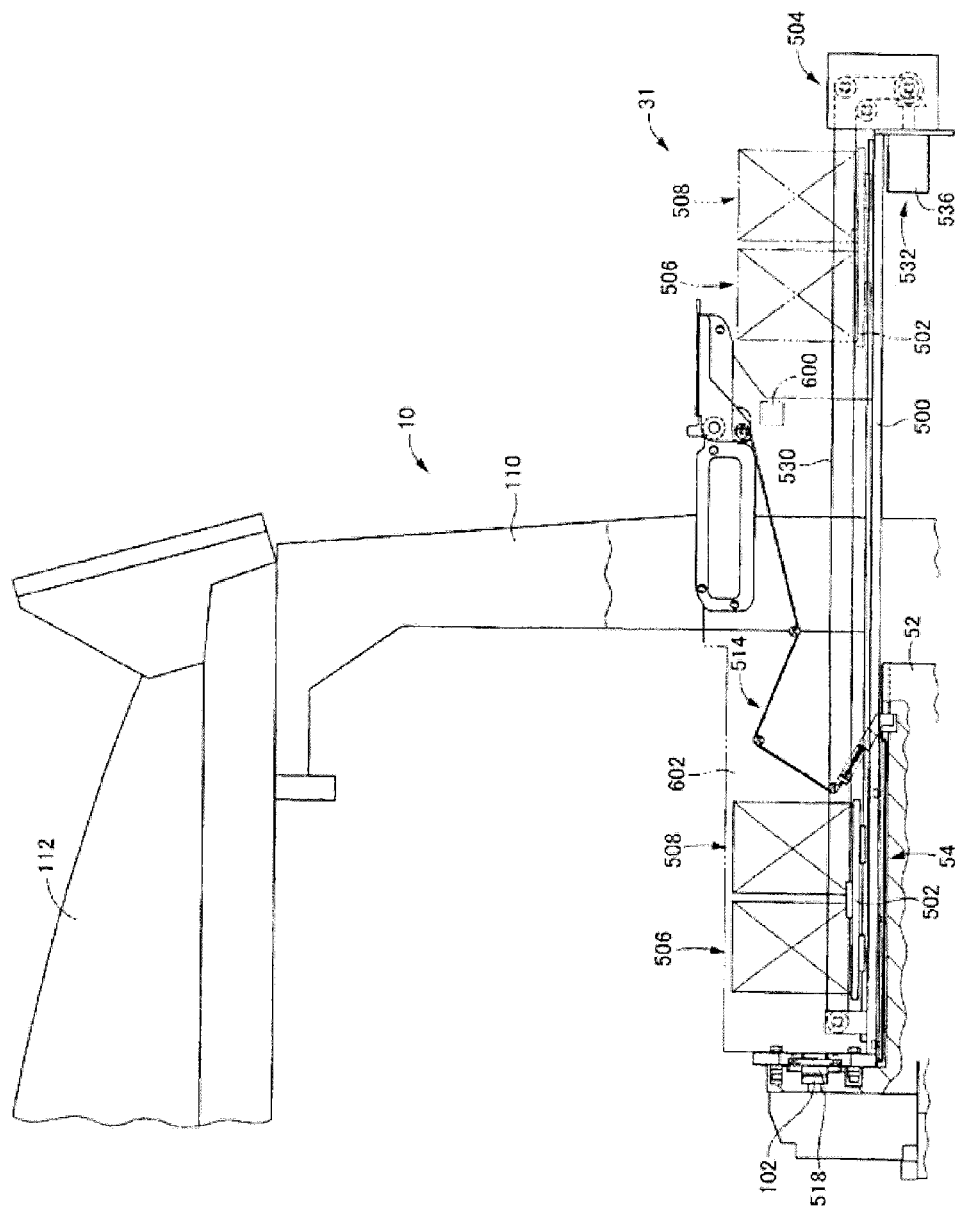

The above passage-equipped component case exchange device 31 is described below. Although not yet made public, the present passage-equipped component case exchange device 31 has the same configuration as the exchange device disclosed in the specifications of Japanese Patent Application 2012-074105 made by the same applicant as this application, and is described simply below. As shown in FIG. 18, the present passage-equipped component case exchange device 31 includes: exchange device main body 500; slide 502 as a moving member which forms a movable member; slide driving device 504 which forms a movable member driving device; component case holding/raising/lowering devices 506 and 508; engaging device 514; and exchange device control device 516 (refer to FIG. 21).

In the present embodiment, passage-equipped component case exchange device 31 is a unit, and as well as being positioned, in the same way as tape feeder 50, in an installation section 54 of the attachment table 52 in an orientation in which the lengthwise direction is parallel to the Y-axis direction and the left-right direction or the widthwise direction is parallel to the X-axis direction, is held in a state which prevents it from rising up from attachment table 52, and is fixed to attachment table 52 by engaging device 514 such that it is attachable/detachable to/from attachment table 52.

Also, for passage-equipped component case exchange device 31, connector 518 which is provided on the front surface of exchange device main body 500 is connected to connector 102 of attachment table 52. By this, exchange device control computer 520 (refer to FIG. 21) which forms the main part of exchange device control device 516 is connected to the module control computer 106 (refer to FIG. 21) and communication is performed. Electric power supply is also performed via connectors 102 and 518. For passage-equipped component case exchange device 31 attached to attachment table 52, the front thereof is positioned inside a space inside the module; the rear thereof protrudes from the front of mounter module 10.

As shown in FIG. 18, slide driving device 504, in the present embodiment, includes endless belt 530 and belt moving device 532. Belt moving device 532 has as a driving source electric motor 536, and slide 502 engaged with belt 530 is moved in the Y-axis direction by the movement of belt 530.

Figure 19:
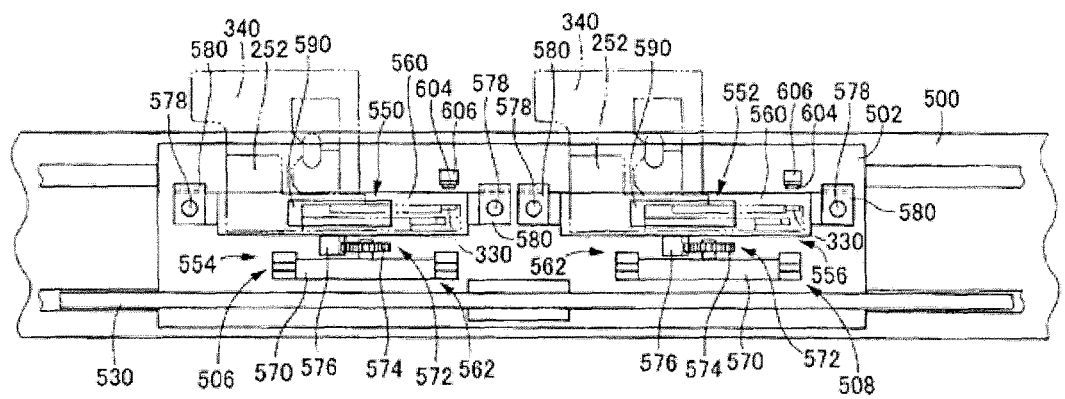
Figure 20:
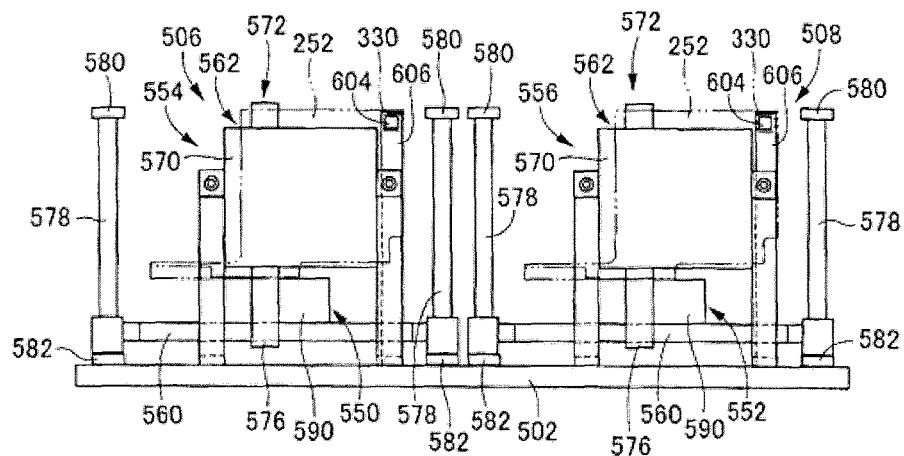

As shown in FIG. 19 and FIG. 20, component case holding/raising/lowering devices 506 and 508 respectively include component case holding sections 550 and 552, and component case holding device raising/lowering devices 554 and 556, and are provided lined up in a direction parallel to the moving direction of slide 502. The configuration of component case holding/raising/lowering devices 506 and 508 is the same, so component case holding/raising/lowering device 506 is described as a representative.

Case holding section raising/lowering device 554 includes raising/lowering member 560 which forms a moving member and raising/lowering member driving device 562 which forms a moving member driving member. Raising/lowering member driving device 562 includes electric motor 570 which forms a driving source, and movement conversion mechanism 572 for converting the rotation of electric motor 570 into linear movement. Movement conversion mechanism 572, in the present embodiment, includes: pinion 574 (refer to FIG. 19) which is rotated by electric motor 570; and rack 576 which is fixed in the vertical direction to raising/lowering member 560 and is engaged with pinion 574; and rack 576 is raised/lowered by pinion 574 being rotated and, raising/lowering member 560 is raised/lowered between an upper limit position and lower limit position while being guided by pair of guide rods 578 (refer to FIG. 20) which form a guiding member. The raising/lowering limit positions of raising/lowering member 560 are defined by stoppers 580 and 582 provided respectively at the ends of guide rod 578.

Component case holding section 550 is provided on raising/lowering member 560. In the present embodiment, component case holding section 550 includes: holding platform 590 on which passage-equipped component case 252 is loaded, and case positioning holding device (omitted from the figures); and detachably holds passage-equipped component case 252. The case positioning holding device, as well as positioning passage-equipped component case 252 in a horizontal direction, holds it with sufficient holding force, and is an item for which the holding is released by moving component case holding section 550 down with respect to passage-equipped component case 252 against the holding force.

Slide 502 is moved between a forward limit position and a rear limit position by slide driving device 504. The forward limit position, as shown by solid lines in FIG. 18, is the position at which component case holding/raising/lowering devices 506 and 508 are positioned at the front of exchange device 31 and positioned within the head moving region of the space inside the module. In the present embodiment, the head moving region is the region in which mounting head 120 is moved above component case holding/raising/lowering device 506 and 508 of slide 502 positioned at the forward limit position. The rear limit position, as shown by two-dash lines, is the position at which component case holding/raising/lowering devices 506 and 508 are positioned at the rear of exchange device 31 and positioned outside mounter module 10. In the present embodiment, the forward limit position and rear limit position of slide 502 are respectively defined by stoppers which are omitted from the figures.

Further, two-dimensional code 600 (refer to FIG. 18) is provided on passage-equipped component case exchange device 31 and configures an exchange device information holding section. On two-dimensional code 600, for example, an identification number which forms identity information for identifying individual passage-equipped component case exchange devices 31 is memorized, and is provided, for example, on side plate 602 of exchange device main body 500. Also, RFID reader-writer 603 (refer to FIG. 21) is provided on exchange device main body 500, and as shown in FIG. 19, separated type antenna 604 thereof is provided on slide 502 by bracket 606 corresponding to each component case holding section 550 and 552.

Figure 21:
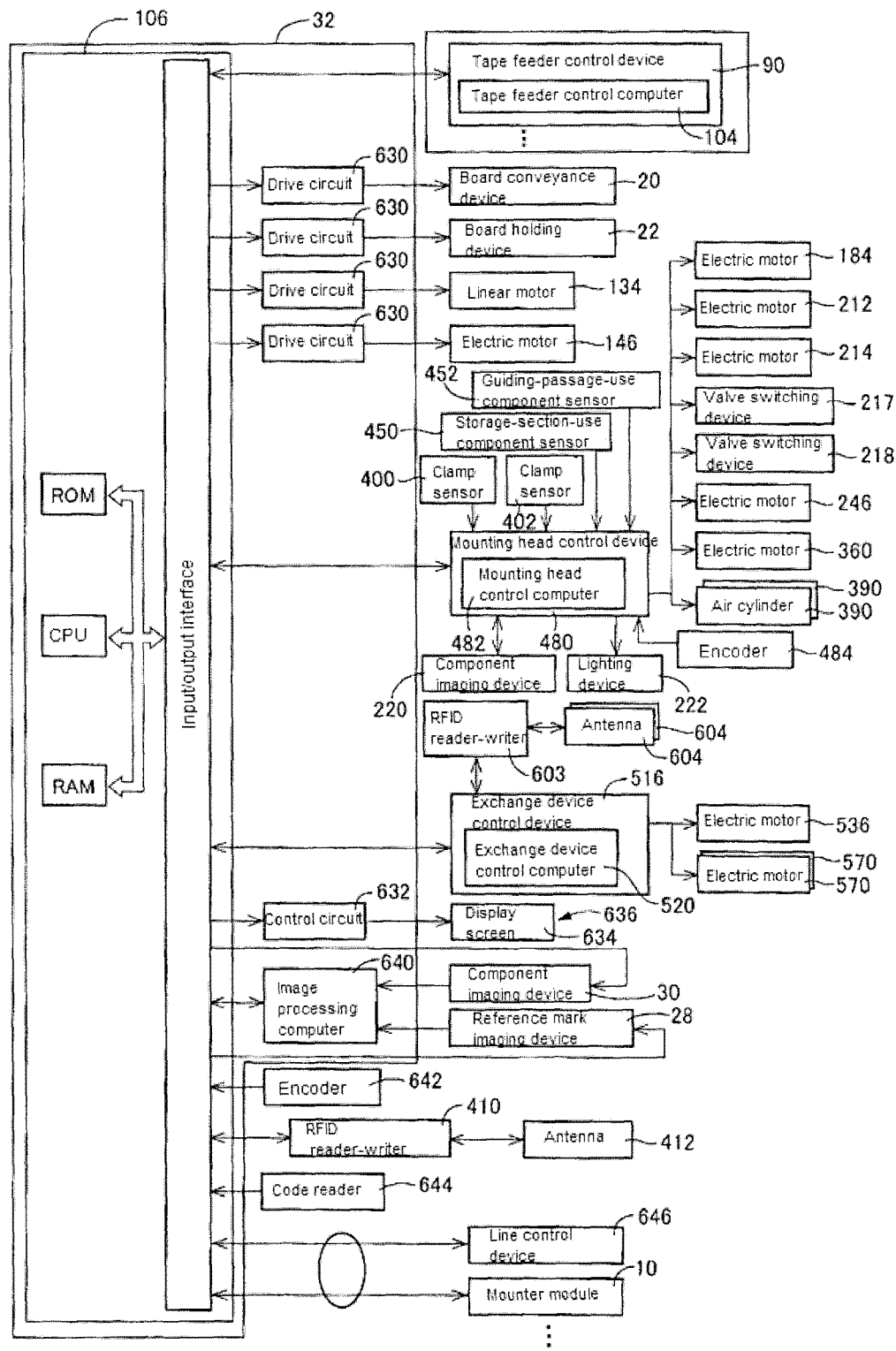

As shown in FIG. 21, module control device 32 controls items such as various driving sources which configure mounter module 10 and linear motor 134 and so on via drive circuit 630, and controls display screen 634 via control circuit 632. Various information and so on is displayed via characters and diagrams and so on display screen 634. Also on display screen 634, displays for performing input and so on of instructions and data and so on are performed, and based on this, an operator performs input by touching display screen 634. As well as display device 636 which forms a read information reporting section being configured from control circuit 632 and display screen 634, in the present embodiment, an input device is also configured. The read information reporting section, instead of display device 636, or together with display device 636, may include at least one of a sound reporting device for reporting information by recorded sound or a communication device which performs communication with respect to a mobile terminal which an operator has. As an input device, a separate device to display device 636 such as a keyboard can be used.

Connected to the input/output interface of module control computer 106 are image processing computer 640 which processes data acquired from the images of reference mark imaging device 28 and component imaging device 30, encoder 642 (one is shown as a representative in FIG. 21) provided on items such as electric motor 146 of X-axis slide moving device 144, RFID reader-writer 410, code reader 644, tape feeder control computer 104, mounting head control computer 482 and exchange device control computer 520, and so on. Note that, image data of component imaging device 220 of mounting head 120 is sent from mounting head control device 480 to image processing computer 640 via module control computer 106 and processed. And, required data is sent from module control computer 106 to mounting head control computer 482.

Also connected to input/output interface via a communication cable are module control device 32 of other mounter modules 10 and line control device 646 which controls overall the entire mounting line. Line control device 646 is configured from a host computer as the main part and manages production information of the mounting line. Further, memorized on the RAM of module control computer 106 are various programs and data and so on such as the mounting control program for the mounting of electronic circuit components on board 40.

In a mounter module 10 configured as above, one supply mode from three is selectively performed in order to mount components on board 40. One is a mode in which components supplied from both tape feeder 50 and bulk component supply device 24 are mounted on one board 40 (hereafter referred to as two-component supply mounting supply mode); one is a mode in which components supplied from only tape feeder 50 are mounted on one board 40 (hereafter referred to as main body side component supply mounting supply mode); and one is a mode in which components supplied from only bulk component supply device 24 are mounted on one board 40 (hereafter referred to as moving type component supply mounting supply mode).

In the present embodiment, by which of the supply modes component mounting is performed is set in advance in the mounting control program. The mounting control program includes, for example, data corresponding to the component mounting order, coordinates of the component mounting positions specified on the component mounting surface of board 40, the types of components to be mounted, the mounting orientation of the components, and so on. Mounting control programs for which two-component supply mounting supply mode is set to be performed also include data of the attachment position (specified by installation section 54) on attachment table 52 of tape feeders 50 and passage-equipped component case exchange device 31. Mounting control programs for which main body side component supply mounting supply mode is set to be performed also include data of the attachment position on attachment table 52 of tape feeders 50; and mounting control programs for which moving type component supply mounting supply mode is set to be performed also include data of the attachment position on attachment table 52 of passage-equipped component case exchange device 31.

Moving type component supply mounting supply mode is described below.

Because by which of the three supply modes mounting of components on board 40 is performed is set in the mounting control program, which type of supply mode is set in the mounting control program is judged in module control computer 106. The component supply device which supplies components is set by the supply mode, and the supply mode judgment is a judgment of by which component supply device components are to be supplied by, and is a judgment as to whether it is necessary for a passage-equipped component case 252 to be attached to head main body 160. In the case of moving type component supply mounting supply mode, it is necessary for a passage-equipped component case 252 to be attached to head main body 160.

When moving type component supply mounting supply mode is performed, passage-equipped component case exchange device 31 is attached to attachment table 52, and transfer of passage-equipped component cases 252 is performed between passage-equipped component case exchange device 31 and mounting head 120. Due to this, the attachment position of passage-equipped component case exchange device 31 on attachment table 52, the type of passage-equipped component case 252 to be used, and the type of component 282 to be supplied are displayed on display screen 634. The type of passage-equipped component case 252 to be used is also included in the mounting control program: An operator, following the instructions of this display, performs attachment of passage-equipped component case exchange device 31 to attachment table 52 and attachment of passage-equipped component case 252 to passage-equipped component case exchange device 31.

If the operator attaches passage-equipped component case exchange device 31 to the specified installation section 54 of attachment table 52, the exchange device related information (information representing the fact that it is a passage-equipped component case exchange device 31 and information individually identifying that exchange device 31, for example, an identification number) memorized in exchange device control computer 520 is sent from there to module control computer 106. Passage-equipped component case exchange device 31 is equipped with connector 518, and if attached to attachment table 52, connector 518 is connected to connector 102 of attachment table 52, and as well as the position of that connector 102 being identified by module control computer 106, information is sent to module control computer 106 via that connector 102. Based on this information of the position to which passage-equipped component case exchange device 31 is attached, a judgment is made as to whether passage-equipped component case exchange device 31 has been attached to the appropriate position. If the judgment result is "no", that fact is displayed on display screen 634 and a correction instruction is given to the operator.

Before or after the attachment of passage-equipped component case exchange device 31 to attachment table 52, passage-equipped component case 252 is made to be held by component case holding sections 550 or 552. When this occurs, an operator reads two-dimensional code 334 of passage-equipped component case 252 with code reader 644 and the read data is sent to module control computer 106 and a judgment as to whether an appropriate item was made to be held is performed. If it is inappropriate, that fact is displayed on display screen 634 to instruct for correction. Whether it is appropriate or not is decided, for example, on whether the type of the passage-equipped component case 252 is the specified type.

If a component storage case 256 is empty, components 282 can enter into storage chamber 272 before or after the attachment of passage-equipped component case 252 to component case holding sections 550 or 552. Component intaking is performed by an operator based on the type of component 282 displayed on display screen 634. Components 282, although omitted from being shown in the figures, are stored, for example, in a bag, and an operator reads the two-dimensional code affixed to the component bag before intake with code reader 644. The type of component 282 and the quantity of component 282 stored in the component bag are included in the data represented by this two-dimensional code, which is sent to module control computer 106, and a judgment is made as to whether the type of component 282 is appropriate. If the type of component 282 is incorrect, that fact is displayed on display screen 634, such that an operator is made to perform component intake work from a bag in which are stored components 282 of the type instructed.

When passage-equipped component case 252 has been held on component case holding sections 550 or 552, communication becomes possible between RFID tag 330 and RFID reader-writer 603 via antenna 604. In a state in which passage-equipped component case 252 in which are stored components 282 is held, and in which passage-equipped component case exchange device 31 is attached to attachment table 52, if the passage-equipped component case 252 is a new item, information regarding that passage-equipped component case 252 is sent from module control computer 106 to exchange unit control computer 520, and written onto RFID tag 330 via antenna 604. For example, the type, identification information, usage start date, and case usage expiry limit of passage-equipped component case 252 are written to RFID tag 330. Identification information is obtained by reading two-dimensional code 334. The usage start date and case usage expiry limit are entered into module control computer 106 by an operator using an input device. In the present embodiment, the case usage expiry limit is set by the component supply count. The deterioration of passage-equipped component case 252 progresses due to component transfer caused by movement of component driving device 254 and so on, and deterioration occurs more the more that the component supply count increases. The case usage expiry limit definition use component supply count is obtained, for example, from the manual regarding passage-equipped component case 252.

Also, the type, intake quantity, intake date, and usage expiry limit of component 282 taken into storage chamber 272 are written onto RFID tag 330. The type and intake quantity of component 282 can be obtained by reading the two-dimensional code of the component bag. The component intake date and component usage expiry limit are entered into module control computer 106 by an operator using an input device when components 282 are taken into storage chamber 272. In the present embodiment, the component usage expiry limit is set by the component supply count. Components 282 stored in storage chamber 272 rub against each other and blackening occurs when passage-equipped component case 252 is moved together with mounting head 120, which decreases the performance of components 282; blackening progresses further the greater the movement of passage-equipped component case 252, and the greater the component supply count. The component usage expiry limit definition use component supply count is obtained, for example, from the explanation regarding the component 282 written on the component bag.

In cases in which passage-equipped component case 252 attached to component case holding section 550 or 552 is already in use, but passage-equipped component case 252 is empty and is not holding components, and components 282 have been taken into storage chamber 272, because information regarding passage-equipped component case 252 has already been written, information regarding component 282 which was taken in is written to RFID tag 330.

In cases in which passage-equipped component case 252 is already in use and components 282 remain inside, the type of component 282 already written onto RFID tag 330 is read by RFID reader-writer 603, sent from exchange device control computer 520 to module control computer 106, and whether it is the specified type of component 282 is checked. If the component type is incorrect, this is displayed on display screen 634 and an operator attaches the correct passage-equipped component case 252.

In addition to the above identification information and so on of passage-equipped component case 252, various moving type bulk component supply device related information which forms moving type component supply device related information is memorized on RFID tag 330. For example, information related to the case overall component supply count which is the accumulated component supply count from the start of usage of passage-equipped component case 252, the post-intake component supply count which is the component supply count after component intake into storage chamber 272 from the component bag, the pickup error occurrence history which is the holding errors of components for bulk component supply device 24, the amount (for example, quantity) of components 282 already stored in storage chamber 272, and the presence/absence of components 282 in storage chamber 272 and guiding passage 306. This information, as described later, is obtained according to the component mounting work performed to board 40 using bulk component supply device 24. The case overall component supply count is in proportion to the accumulated usage time of passage-equipped component passage 252.

If the type of passage-equipped component case 252 specified in the mounting control program which is a passage-equipped component case 252 in which are stored components 282 specified in the mounting control program is held on component case holding section 550 or 552, and passage-equipped component case exchange device 31 is attached in the specified position on attachment table 52, a passage-equipped component case 252 held by one of component case holding sections 550 or 552, for example, component case holding section 550, is attached to head main body 160. This attachment operation is described later together with exchange of passage-equipped component cases 252 between head main body 160 and passage-equipped component case exchange device 31, and here it is left that attachment of passage-equipped component case 252 onto head main body 160 has been performed.

After attachment of passage-equipped component case 252 to head main body 160 has been performed, checking whether passage-equipped component case 252 is attached to head main body 160 is performed. When moving type component supply mounting supply mode is performed, it is necessary for a passage-equipped component case 252 to be attached to head main body 160, and the performance/non-performance of that attachment is judged to check attachment. In the present embodiment, this check is performed based on the presence/absence of communication between RFID reader-writer 410 and RFID tag 330, and each detection signal of clamp sensors 400 and 402. In a state in which passage-equipped component case 252 is clamped by clamping devices 382 and 384, and held on head main body 160, the state becomes such that RFID tag 330 is facing antenna 412 and information written on RFID 330 can be read. Due to this, if communication can be performed between RFID reader-writer 410 and RFID tag 330, and information of RFID tag 330 can be read, it can be assumed that a passage-equipped component case 252 is present; and if communication cannot be performed and information cannot be read, it can be assumed that there is no passage-equipped component case.

Further in the present embodiment, a case presence/absence judgment is performed considering the detection signals of clamping sensors 400 and 402, and in cases in which the presence/absence of passage-equipped component case 252 by the presence/absence of information reading and the presence/absence of passage-equipped component case 252 from the detection signals of clamp sensors 400 and 402 match, the presence/absence of a case is judged according to that. In other words, in cases in which the detection signals of clamp sensors 400 and 402 are an on signal and information can be read, it is taken that a case is present; and in cases where information cannot be read and the detection signals of clamp sensors 400 and 402 are an off signal, it is taken that there is no case. If a passage-equipped component case 252 is not attached, that fact is reported by being displayed on display screen 634. Also, operation of mounter module 10 is prohibited. Operation prohibition is memorized on the RAM of module control computer 106, such that the running program for the running of the mounting control program cannot be started. Based on this report, an operator performs countermeasures to a passage-equipped component case 252 not being attached.

Conversely, in cases in which the presence/absence of information reading and the detection signals of clamp sensors 400 and 402 do not match, it is taken as an error, and the occurrence of an error, the error contents, and the type of passage-equipped component case 252 and so on are reported by being displayed on display screen 634. Based on this report, an operator performs appropriate processing with respect to the error. Also, operation of mounter module 10 is prohibited. By the checking for the performance/non-performance of the attachment of passage-equipped component case 252 in this way, the starting of component mounting onto board 40, after taking it that attachment has been performed even though a passage-equipped component case 252 is not attached to head main body 160, can be prevented. In particular, by basing judgment on the detection signals of clamp sensors 400 and 402 in addition to the presence/absence of information reading, the presence/absence of a case is judged more accurately.

If a passage-equipped component case 252 is attached to head main body 160 and information memorized on RFID tag 330 can be read, the read information is reported to an operator by being displayed on display screen 634. The operator performs appropriate measures as required based on the contents of the displayed information. For example, in cases in which the time elapsed since the start of usage of passage-equipped component case 252 is long, the operator ends usage of that passage-equipped component case 252 and exchanges it for a new passage-equipped component case 252.

Also, in module control computer 106, whether a passage-equipped component case 252 in which component 282 which should be supplied is stored is being held is re-checked from the component type information included in the read information. If the type of component 282 is incorrect, that fact, the type of component 282 currently being held, the type of component 282 which should be supplied and so on, are displayed on display screen 634. Also, operation of mounter module 10 is prohibited. An incorrect passage-equipped component case 252 is transferred from head main body 160 to passage-equipped component case exchange device 31 and exchanged by an operator for a passage-equipped component case 252 in which are stored the specified components 282.

If a passage-equipped component case 252 is held on head main body 160 and the type of components 282 which should be supplied are stored in that passage-equipped component case 252, mounting of components 282 onto board 40 starts. If any measures whatsoever regarding the passage-equipped component case 252 are performed by an operator based on the display of read information, mounting is started after those measures.

Bulk component supply device 24, as well as being moved together with mounting head 120 by heading moving device, supplies components 282 to suction nozzles 172 from component supply section 316 during that movement. Suction nozzle 172 which has reached the component take-out position by the rotation of rotating body 182 is lowered and takes out component 282 from component supply section 316. With bulk component supply device 24, after the takeout of component 282 by suction nozzle 172, as well as component driving device 254 being operated before the takeout of component 282 by the next suction nozzle 172, air inside guiding passage 306 is sucked, and as well as components 282 being transferred from storage chamber 272 to guiding passage 270, components 282 inside guiding passages 270 and 306 are sent to component supply section 316 arranged in a line.

In module control computer 106, the quantity of components 282 which bulk component supply device 24 supplies is counted, and each time the multiple suction nozzles 172 reach the component takeout position in turn and takeout of a component 282 is performed, the case overall component supply count and post-intake component supply count are each increased by one. These counts are performed as the respective initial values of the case overall component supply count and post-intake component supply count included in the read information which is read from RFID tag 330. In the present disclosure, the component intake into storage chamber 272 is performed in a state in which passage-equipped component case 252 is empty and there are no components 282 in either storage chamber 272 or guiding passages 270 and 306, and the post-intake component supply count is reset to zero with each intake of components 282. Due to this, immediately after component intake, the initial value of the post-intake component supply count is zero, and is taken as zero when the component intake quantity and so on are written onto RFID tag 330.

An image of suction nozzle 172 holding a component 282 is captured at the component imaging position by component imaging device 220, and the holding position deviation of component 282 on suction nozzle 172 is acquired. Also, a pickup error is detected based on this image. A pickup error is when, for example, even though suction nozzle 172 performed takeout operation of component 282 from bulk component supply device 24, there is no pickup and a component 282 is not being held, suction nozzle 172 took out component 282 but component 282 is standing up on its end, a shifted orientation error for which the specified value with respect to suction nozzle 172 was exceeded, or component 282 was flipped upside-down. Components 282 with a component holding orientation error and so on are put into a component collection box without being mounted on board 40. Pickup errors may be detected not just by an image from component imaging device 220, but may also be detected by providing, for example, a pickup error detection device at the component takeout position, for example a sensor or imaging device which takes an image of a suction nozzle from a direction intersecting the axis line of that suction nozzle. If a pickup error occurs, for example, the pickup error contents, occurrence time, and occurrence quantity are memorized together with the identification information of passage-equipped component case 252 in the pickup error information memory. Pickup error information memory is provided in the RAM of module control computer 106 and configures a memorizing means.

In module control computer 106, a state judgment of passage-equipped component case 252 is performed combining pickup error information memorized on pickup error information memory and the pickup error occurrence history read from RFID tag 330. The pickup error occurrence history includes pickup error information for all errors which have occurred up to that point for passage-equipped component case 252, and for example, in cases in which the pickup error occurrence quantity is high compared to the case overall component supply count, it is judged that there is some defect with passage-equipped component case 252. In particular in cases in which there are many occurrences of no pickup, for example, it is supposed that there is a defect with the component transfer from storage chamber 272 to guiding passage 270 by component driving device 254, or a component movement defect in guiding passage 270 or 306.

Then, defect occurrences, defect contents, supposed defect causes, measures with respect to defects, and so on are displayed together with identification information of passage-equipped component case 252 on display screen 634. As defect measures, for example, maintenance warnings, bulk component supply device 24 configuration components exchange warnings, and instructions as to the location of that maintenance and component exchange location are performed. Based on pickup errors which occurred in the past, data linked to the error contents, cause, and measures is created, memorized in the RAM of module control computer 106, and defect causes and so on are acquired and displayed based on this data.

With passage-equipped component case 252, due to usage over a long time, for example, dust accumulates in guiding passages 270 and 306, and wear occurs in the groove, by which transfer of components 282 from storage chamber 272, or component transfer in guiding passages 270 and 306, may no longer be performed smoothly, and transfer defects for components 282 may also occur due to deterioration of the configuration components of passage-equipped component case 252. Due to this, an operator is made to perform inspection and cleaning, or exchange of configuration components, of guiding passages 270 and 306 based on the display, to resolve the defect. This work may be performed after the completion of component mounting onto one board 40 without performing an interruption of mounting work, or may be performed after the completion of component mounting onto a specified quantity of boards 40, and may be performed when components 282 run out and passage-equipped component case 252 is exchanged. Whichever, passage-equipped component case 252 is lowered from head main body 160 to passage-equipped component case exchange device 31 for the sake of defect resolution work.

After taking an image of component 282, suction nozzle 172 is moved to the component mounting position and mounts component 282 on board 40. Here, the holding position deviation of component 282 on suction nozzle 172 is corrected together with the position deviation of the component mounting position of board 40. Suction nozzle 172, as well as being rotated to the component mounting position, is lowered through opening 344 in dropped component catch plate 340 to a downward position protruding below dropped component catch plate 340, and mounts component 282 on board 40.

After suction nozzle 172 takes out a component from bulk component supply device 24, there are cases in which component 282 comes off and drops from suction nozzle 172 while being moved to the component imaging position or component mounting position. In that case, dropped component 282 is caught by dropped component catch plate 340, and thereby prevented from dropping from head main body 160 onto board 40. Dropped components 282 drop directly onto sheet 346 of dropped component catch plate 340, or drop onto inclined surface 430 as shown in FIG. 13, and drop onto sheet 346 after being guided by inclined surface 430. If there are cases in which components 282 drop above opening 224 of lighting device 222, they are caught by dropped component catch plate 340 after being guided downwards by the incline of mirror 238 of light-guiding device 236. Because inclined cover 232 covers LEDs 230 provided on opening 224, dropped components 282 do not get caught on LEDs 230 and are guided onto inclined surface 233 of cover 232, drop onto mirror 238, and drop onto dropped component catch plate 340. Also, even if a component 282 which has come off suction nozzle 172 is thrown outside the rotational axis path, it strikes wall 422 or 423 (refer to FIG. 11) surrounding the rotational axis path or attachment section 424 (refer to FIG. 11) which configures head main body 160, and are dropped onto dropped component catch plate 340. There are also cases in which components 282 drop onto covers 308 and 310 of passage-equipped component case 252, but these dropped components 282 are removed from head main body 160 together with passage-equipped component case 252. Due to this, no inclined surface is provided on covers 308 or 310, and dropped components 282 are left as is.

Silicone sheet 346 is highly adhesive, this preventing dropped components 282 from springing, shifting, or moving relative to dropped component catch plate 340. Due to this, components 282 which have dropped onto the exposed section of dropped component catch plate 340 are prevented from falling from dropped component catch plate 340 due to shocks imparted to dropped component catch plate 340 due to the acceleration and deceleration when movement of mounting head 120 starts and stops. Opening 344 is formed in a section corresponding to the component mounting position of dropped component catch plate 340, but components 282 which have dropped around this opening are also prevented from falling through opening 344. Also, the section covering the opening of concavity 226 in which is provided light-guiding device 236 of dropped component catch plate 340 contacts the opening peripheral section of concavity 226, and although sheet 346 is not affixed to this section, dropped components 282 are prevented from dropping from dropped component catch plate 340 by the section demarcating concavity 226 of head main body 160.

While performing component mounting to board 40 in this way, the post-intake component supply count and the component usage expiry limit definition use component supply count are compared in module control computer 106, and if the component supply count is equal or greater than that stipulated, a warning is displayed on display screen 634. The fact that components stored in passage-equipped component case 252 have exceeded the blackening limit is displayed together with the identification information of passage-equipped component case 252. When this occurs, mounting work is interrupted, passage-equipped component case 252 is delivered from head main body 160 to passage-equipped component case exchange device 31, and an operator exchanges the passage-equipped component case 252 for a passage-equipped component case 252 in which are stored components 282 which have not exceeded the blackening limit.

Also, the case overall component supply count is compared to the case usage expiry limit definition use component supply count, and if it is equal to or greater than that stipulated component supply count, the fact that the passage-equipped component case 252 has reached the usage limit is displayed on display screen 634 together with identification information of the passage-equipped component case 252.

An operator performs appropriate processing based on the display. An operator, for example, performs inspection, maintenance, or component exchange for passage-equipped component case 252 and component driving device 254, so as to continue further use of passage-equipped component case 252 or to discard passage-equipped component case 252 as having reached the end of its life. This processing, in the same way as the processing when a case is judged as defective based on pickup error information, is performed at an appropriate time, such as after mounting of a specified quantity of components on board 40. By the time elapsed since the start of usage of passage-equipped component case 252 being compared to the specified time, a judgment can be made as to the necessity of performing maintenance and so on for passage-equipped component case 252.

Maintenance and so on is performed, and when passage-equipped component case 252 is to be used again, that fact is entered into module control computer 106 together with the identification information of passage-equipped component case 252. Then, following that, when that passage-equipped component case 252 is held on head main body 160 and supplies components 282, "0" is counted as the initial value for the case overall component supply count. Because the passage-equipped component case 252 is post-maintenance and is not a new item, the initial value may be a number larger than "0".

The component remaining quantity in passage-equipped component case 252 is also acquired by module control computer 106. The initial value for the remaining component quantity is taken as the component storage count of passage-equipped component case 252 obtained from the information memorized on RFID tag 330, and is acquired by reducing the quantity by one each time one component 282 is taken out. Immediately after component intake the component intake quantity is the component storage count, and is taken as the initial value of the component remaining quantity.

Further, the presence of components 282 in passage-equipped Component case 252 is detected by component sensors 450 and 452 in the present mounter module 10. Components 282 are detected by guiding-passage-use component sensor 452, but if a state which can be taken to indicate that components 282 have run out in storage chamber 272 is detected based on the detection signal of storage-section-use component sensor 450, the fact that components 282 have run out in storage chamber 272, the type of component 282, and the performance of preparation for component replenishment is displayed on display screen 634 together with case identification information, so as to report to the operator.

In this state, components 282 are still inside guiding passages 270 and 306, and bulk component supply device 24 can still supply components 282. This means a component replenishment request based on the detection signal of storage-section-use component sensor 450 is performed early. And, if it is detected that components 282 have run out in the section from the component detection position of guiding-passage-use component sensor 452 of guiding passage 306 to storage chamber 272 based on the detection signal of guiding-passage-use component sensor 452, it can be understood that the component remaining quantity has become the quantity of components 282 which are between the component detection position of guiding passage 306 and component supply section 316. This component remaining quantity is obtained from a calculation based on the dimensions of component 282 and the distance from the component detection position to component supply section 316 as obtained from the designs. Due to this, after detection, the component takeout count is counted in module control computer 106, and if that count is equal to or greater than the quantity of component between the component detection position and the component supply position, a judgment is performed together with the imaging result from component imaging device 220 as to whether components have run out, and if an image of a component 282 has not been'captured, it is taken that components have run out.

If components 282 have also run out inside guiding passage 306, a component 282 will not be held even if suction nozzle 172 performs component takeout operation, and an image of a component 282 will not be captured by component imaging device 220. However, even if there is a component 282 in passage-equipped component case 252, the situation of not capturing an image of a component 282 may arise as a result of a dropped component 282 and so on, so judging that components 282 have run out based on only the fact that an image of a component 282 has not been captured is premature. Further, although it is also possible to assume that components have run out in the case in which the component remaining quantity is zero based on the count of the remaining quantity in passage-equipped component case 252 overall, there are cases in which the remaining quantity is different from reality due to the error in the intake quantity during component intake to storage chamber 272. When components 282 are put into storage chamber 272 from the component bag, it is possible that some components are spilled, or remain in the bag, thus causing the intake quantity to be fewer than the defined quantity. Further, if a pickup error occurs and a component 282 is not taken out, a component 282 will be taken out and an image captured even if the component takeout count is equal to or greater than the quantity of components between the component detection position and the component supply position. Due to this, in the present embodiment, judgments as to whether components have run out are performed based on the component takeout count after components are no longer detected by guiding-passage-use component sensor 452 and the imaging result of component 282, thus accurate judgments are made as to whether components have run out.

If components 282 run out in passage-equipped component case 252, mounting operations are stopped and component replenishment is performed. Component replenishment is performed by the passage-equipped component case 252 which became empty being exchanged with a passage-equipped component case 252 for which components 282 are stored in storage chamber 272 and which is being held by one of the component case holding sections 550 and 552 of passage-equipped component case exchange device 31. Also, the fact that components 282 have run out in passage-equipped component case 252 and an instruction to perform component replenishment for the empty passage-equipped component case 252 are displayed together with the case identification information on display screen 634, thereby instructing the operator.

The detection signal of component sensors 450 and 452 can also be used for error detection. For example, while the specified count of component takeout is performed even though storage-section-use component sensor 450 is outputting an on signal, if guiding-passage-use component sensor 452 is continuously outputting an off signal, it can be assumed an error is occurring. If supply of components 282 is performed correctly, an off signal will be output continuously by storage-section-use component sensor 450 before guiding-passage-use component sensor 452, so an error is occurring if the opposite state occurs. As a reason for this, for example, it is possible that a component transfer problem occurred to guiding passage 270 by component driving device 254, or a blockage may have occurred at least one of guiding passages 270 and 306. In this case, as well as mounting operations being stopped immediately, items such as the occurrence of a component supply problem and the performance of problem countermeasures are reported by being displayed on display screen 634. Passage-equipped component case 252 is lowered from head main body 160 to passage-equipped component case exchange device 31, and an operator performs inspection, maintenance, and so on of passage-equipped component case 252. In other words, passage-equipped component case 252 held on head main body 160 is exchanged with a spare passage-equipped component case 252 which is a passage-equipped component case 252 held on passage-equipped component case exchange device 31, such that mounting operations can continue to be performed.

Information obtained during component mounting operations, in other words, the pickup error occurrence history, case overall component supply count, post-intake component supply count, and the component remaining quantity, is written to RFID tag 330 via antenna 412 by RFID reader-writer 410 prior to the removal when passage-equipped component case 252 is removed from head main body 160. The case overall component supply count, post-intake component supply count, and the component remaining quantity are rewritten, and the pickup error occurrence history is added as the pickup error information. Also, the information on the presence of components 282 in storage chamber 272 and guiding passage 306 obtained based on the detection signal of storage-section-use component sensor 450 and guiding-passage-use component sensor 452 is written to RFID tag 330. This information may be written to RFID 330 each time it is obtained.

By writing information to RFID tag 330, for example, even if the passage-equipped component case 252 is to be used next on the same mounter module 10 to the mounter module 10 on which it was previously used, and in cases in which the passage-equipped component case 252 is to be used next on a different mounter module 10, the information memorized on RFID tag 330 can be used. By this, supplying the wrong type of components is prevented, maintenance of passage-equipped component case 252 is performed at the appropriate time, and components 282 and passage-equipped component cases 252 for which the usage limit has expired are not used, and so on, thereby improving the workability of maintenance, component exchange, case exchange, and so on; further, passage-equipped component cases 252 can be used as much as possible in a good state, thereby improving component supply performance, and achieving the effect of improved quality of production boards. Also, it is not necessary to manage information of passage-equipped component cases 252 or storage components at mounter module 10.

Exchange of passage-equipped component cases 252 is described below based on FIG. 22. It should be noted that, the passage-equipped component case currently held on head main body 160 is referred to as leading passage-equipped component case 252; and a passage-equipped component case 252 in which are stored the same type of components 282 as supplied by leading passage-equipped component case 252 which is held by one of the component case holding sections 550 and 552 and which is a different passage-equipped component case 252 to leading passage-equipped component case 252 is referred to as following passage-equipped component case 252. In a state in which a passage-equipped component case 252 is attached to head main body 160, following passage-equipped component case 252 is held by one of the two component case holding sections 550 and 552 of passage-equipped component case exchange device 31, and the other case holding section does not hold a passage-equipped component case 252 and is empty.

Figure 22:
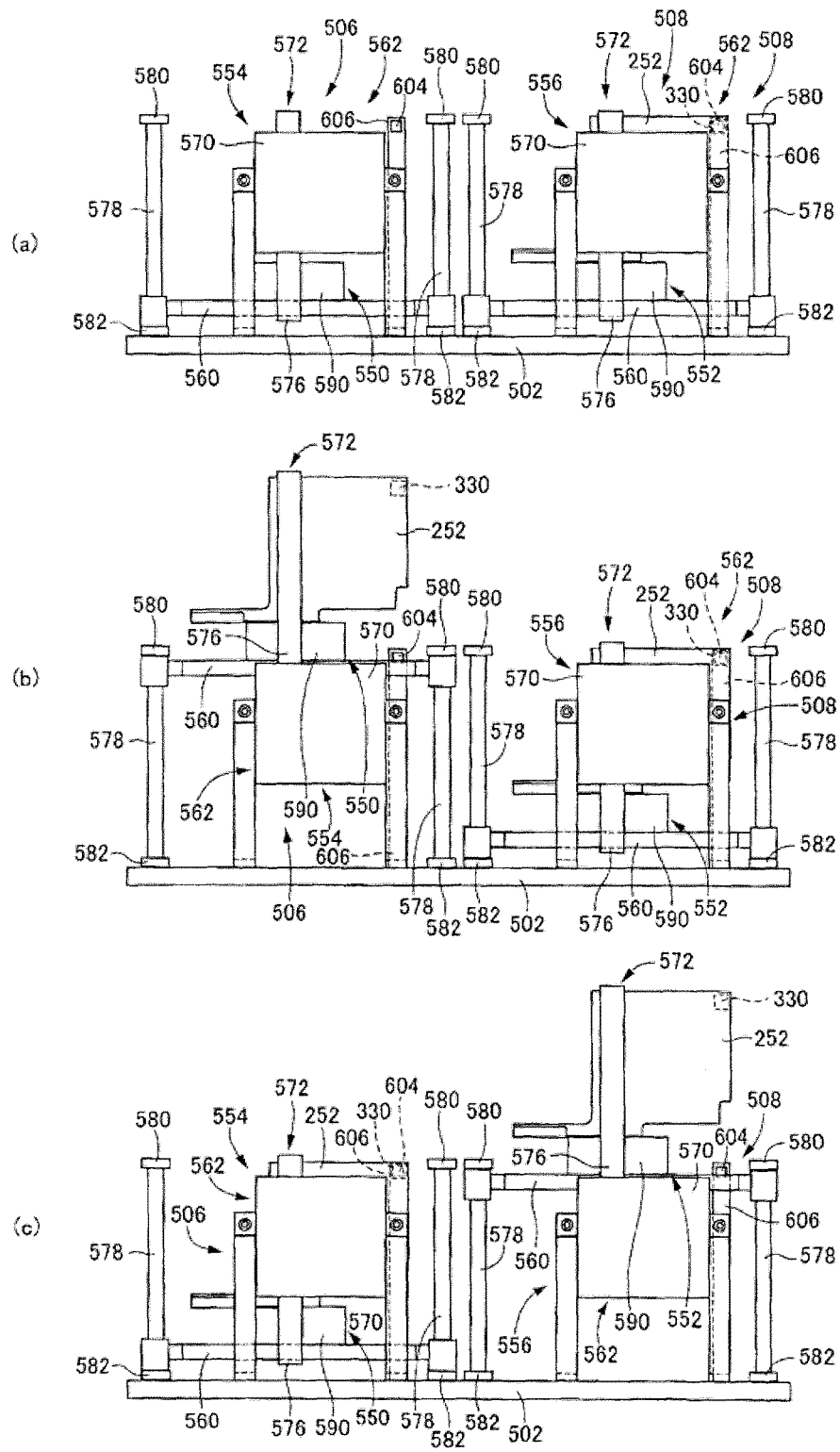

During exchange, slide 502 is positioned at a forward limit position, and leading passage-equipped component case 252 is moved by mounting head 120 onto an empty case holding section, which in the example shown in FIG. 22 (a) is the front side case holding section 506. Here, raising/lowering member 560 is positioned at the lower limit position, and component case holding section 550 is positioned at a retract position. Mounting head 120 is moved to a predetermined case transfer position with respect to empty component case holding section 550. This position is a position at which leading passage-equipped component case 252 is held by component case holding section 550 in a state positioned at a position specified in the X-axis direction and Y-axis direction.

After the movement of leading passage-equipped component case 252, as shown in FIG. 22 (b), raising/lowering member 560 is raised to the upper limit position, and component case holding section 550 is raised to the case transfer position. This position is the position at which leading passage-equipped component case 252 is placed onto case holding platform 590, and leading passage-equipped component case 252 is held by a case positioning holding device. After holding, the clamping of leading passage-equipped component case 252 by clamping devices 382 and 384 is released, and then component case holding section 550 is lowered to the retract position. By this, positioning pins 320 and 322 are removed from positioning holes 406 and 408, concavity 268 is separated from rotating disk 350, and leading passage-equipped component case 252 is removed from mounting head 120 with all of component driving device 54 being held as is on mounting head 120.

After the removal of leading passage-equipped component case 252, mounting head 120 moves following passage-equipped component case 252 to a case transfer position specified in advance with respect to a case holding section, here component case holding section 552. After movement, as shown in FIG. 22 (c), raising/lowering member 560 is raised to the upper limit position, and component case holding section 552 holding following passage-equipped component case 252 is raised to the case transfer position. By this, as well as concavity 268 of following passage-equipped component case 252 being engaged with rotating disk 350, and positioning pins 320 and 322 being engaged with positioning holes 406 and 408, the section surrounding positioning pins 320 and 322 of guiding passage forming body 258 are contacted against the lower surface of head main body 160. After the raising of component case holding section 552, clamping claw 386 is rotated to the clamp position, and as well as following passage-equipped component case 252 being held by mounting head 120 in a state positioned in a vertical direction and a horizontal direction, the state becomes such that moving force can be applied to components 282 inside storage chamber 272 in the direction of component passages 270 and 306 by component driving device 54.

After following passage-equipped component case 252 is held by mounting head 120 and has become leading passage-equipped component case 252, component case holding section 552 which was holding that passage-equipped component case 252 is lowered to the retract position and becomes an empty component case holding section 552. Then, mounting head 120 recommences mounting onto board 40 of components 282 supplied from the new leading passage-equipped component case 252. Before the recommencing of mounting, reading of information memorized on RFID tag 330 is performed and checking for the presence of a case and checking the component type and so on are performed. Also, slide 502 is moved to the rear limit position and components 282 are put into the empty component storage case 256 by an operator. After intake of the components, slide 502 is moved to the front limit position to be on standby for the next exchange of passage-equipped component case 252.

In this way, when a passage-equipped component case 252 is removed and attached from and to mounting head 120, dropped component catch plate 340 fixed to passage-equipped component case 252 is automatically attached or removed with respect to mounting head 120. If there are components 282 which have been caught by dropped component catch plate 340, after removal from mounting head 120, with slide 502 in a state moved to the rear limit position, an operator removes the dropped components from dropped component catch plate 340. Work is easier compared to performing removal of dropped components in a state in which the dropped component catch plate is attached as is to mounting head 120, but because dropped component catch plate 340 is attached to passage-equipped component case 252 and is removed from mounting head 120 together with passage-equipped component case 252, attachment/removal with respect to mounting head 120 is easy, and removal of dropped components can be performed particularly easily and quickly. Because dropped component catch plate 340 is removed from head main body 160 together with passage-equipped component case 252 in a horizontal orientation, components 282 which dropped onto sheet 346 of course do not drop from dropped component catch plate 340, and components 282 which dropped onto a section other than sheet 346 also do not drop from dropped component catch plate 340. Removal of dropped component catch plate 340 from mounting head 120 is performed at a position separated from board holding device 22 which is on passage-equipped component case exchange device 31, and because it is performed at a position below which there is no board 40, even if a dropped component 282 did by chance drop from dropped component catch plate 340, it would not drop on a board 40.

Also, there are cases in which components 282 drop onto covers 308 and 310 of passage-equipped component case 252, but the top surface of covers 308 and 310 is not inclined, and components 282 remain as is on top of covers 308 and 310. These components 282 remain as is on top of covers 308 and 310 when passage-equipped component case 252 is removed from head main body 160 and are removed together with dropped components on dropped component catch plate 340. It should be noted that removal of dropped components may be performed with passage-equipped component case 252 attached as is to passage-equipped component case exchange device 31, or may be performed with passage-equipped component case 252 removed from passage-equipped component case exchange device 31.

Component mounting by main body side component supply mounting supply mode is described below.

In this case too, that the type of supply mode to be performed is main body side component supply mounting supply mode is known from the mounting control program settings. When this supply mode is performed, because component supply is not performed by bulk component supply device 24, it is not necessary for passage-equipped component case 252 to be attached to head main body 160.

Due to this, if component supply is set to main body side component supply mounting supply mode, whether a passage-equipped component case 252 is attached to head main body 160 is judged. This judgment, in the present embodiment, is performed in the same way as the judgment as to whether a passage-equipped component case 252 is attached to head main body 160 when moving type component supply mounting supply mode is being performed. If a passage-equipped component case 252 is attached to head main body 160, head moving device 122 and passage-equipped component case exchange device 31 are operated and passage-equipped component case 252 is transferred from head main body 160 to passage-equipped component case exchange device 31 and removed from head main body 160. Due to this, passage-equipped component case 252 is not moved together with head main body 160 when not supplying components 282, and unnecessary advancement of the blackening of components 282 is prevented, the lifespan of components 282 is lengthened, and increased mounting costs are avoided.

In main body side component supply mounting supply mode, components supplied by tape feeders 50 are mounted onto board 40. For this, mounting head 120 is moved to tape feeder 50 and receives components. Suction nozzle 172 is lowered at the component mounting takeout position, picks up a component and takes it out from tape feeder 50. When all the suction nozzles 172 held on head main body 160 have received a component, mounting head 120 is moved to board 40. After takeout, an image of component 282 is captured by component imaging device 220 at the component imaging position, and component 282 is mounted on board 40 at the component mounting takeout position.

Two-component supply mounting supply mode is described below.

When this mode is performed, passage-equipped component case 252 is held on head main body 160. This holding is performed in the same as when performing moving type component supply mounting supply mode. Mounting of components supplied by bulk component supply device 24 and tape feeders 50 onto board 40 is disclosed, for example, in JP-A-2013-69798, and descriptions are thus omitted. When performing this mode too, with regard to bulk component supply device 24, in the same way as when performing moving type component supply mounting supply mode, as well as a judgment being performed as to whether passage-equipped component case 252 is present, information memorized on RFID tag 330 is used and a judgment as to whether passage-equipped component device 252 is defective and so on is performed.

As is clear from the above descriptions, in the present embodiment, moving type bulk component supply device 24 configures first component supply device, module main body side component supply device 23 configures second component supply device, and these configure the component supply device which supplies components at mounter module 10.

Also, in the present embodiment, clamp sensors 400 and 402 configure a detachable section sensor which detects whether a passage-equipped component case 252 is attached to head main body 160 or to second X-axis slide 142; the section which judges whether a passage-equipped component case 252 is attached to head main body 160 based on the detection signal of clamp sensors 400 and 402 and on whether information reading of module control computer 106 was performed configures a detachable section presence judging section; and the section which judges that a passage-equipped component case 252 is not attached to head main body 160 based on the fact that RFID reader-writer 410 does not read information memorized in the memorizing section of RFID tag 330 and that the detection signal of clamp sensors 400 and 402 is an off signal configures a detachable section not present judging section. Further, RFID tag 330 configures a moving type component supply device related information memorizing section; the section which displays passage-equipped component case defects, whether maintenance is required, and whether exchange is required using the pickup error occurrence history, case overall component supply count, and case usage expiry limit definition use component supply count memorized on RFID tag 330 of module control computer 106 together with case identification information configures a moving type component supply device state information reporting section which performs at least one out of exchange-required notices, maintenance-required notices, and defect notices for the moving type component supply device; the section which detects the fact that components 282 held by passage-equipped component case 252 have reached the usage limit using the post-intake component supply count and the component usage expiry limit definition use component count and displays that together with case identification information configures a component usage limit reached reporting section; the section which detects the fact that passage-equipped component case 252 has reached the usage limit using the case overall component supply count and the case usage expiry limit definition use component supply count and displays that together with case identification information configures a detachable section usage limit reached reporting section; and these configure a read information usage section. In cases in which information related to the presence of an electronic circuit component which is memorized on RFID tag 330, is information in which a component 282 is in guiding passages 270 and 306 but not in storage chamber 272, when passage-equipped component case 252 is attached to head main body 160 and that information is read, a component replenishment request can be output. The section which requests component replenishment based on this read information of module control computer 106 configures a component replenishment requesting section which forms a read information usage section.

And further, the section which controls mounting device 26 based on the mounting control program of module control computer 106 and performs takeout and mounting of components by suction nozzle 172 configures a main control section; the section which judges which of the supply modes is set in the mounting control program configures a mounting control program dependent required judging section which forms a detachable section required judging section which judges whether a detachable section is required based on the mounting control program; the section which displays the fact that it has been detected that a passage-equipped component case 252 is attached to head main body 160 even though component mounting by main body side component supply mounting supply mode is set in the mounting control program on display screen 634 configures a reporting control section; and the section which prohibits operation of mounting device 26 configures an operation prohibiting section.

Also, in the present embodiment, multiple, for example, two, component case holding sections are provided on passage-equipped component case exchange device 31, and as well as being such that passage-equipped component case 252 in which are stored components 282 is held separate to passage-equipped component case 252 which supplies components 282 which is attached to head main body 160, each component case holding section 550 and 552 is raised/lowered individually by case holding section raising/lowering devices 554 and 556. It follows that, in the present embodiment, component case holding sections 550 and 552 each configure a detachable section stocker; case holding section raising/lowering devices 554 and 556 each configure an automatic attachment/removal device which automatically performs attachment to the movable member side section of the detachable section and storage to the detachable section stocker; and component case holding/raising/lowering devices 506 and 508 each configure a shared detachable section stocker and automatic attachment/removal device. Component case holding/raising/lowering devices 506 and 508 are each a detachable section stocker and automatic attachment/removal device, and all sections of the detachable section stocker and automatic attachment/removal device are shared.

Further, the section which displays the component replenishment request on display screen 634 based on the detection signal of storage-section-use component sensor 450 configures a sensor signal dependent component replenishment requesting section.

It should be noted that, component replenishment requests at the moving type component supply device may be performed when the component remaining quantity counted with the component remaining quantity memorized in the information memorizing section provided on the detachable section as the initial value is equal to or fewer than a set quantity. In this case, the section which compares the component remaining quantity counted with the component remaining quantity of the control device as the initial value to the set quantity and performs component replenishment requests configures a component replenishment requesting section which forms a read information usage section.

Also, component replenishment requests may be reported based on information related to the presence of components in at least one of the component storage section and guiding passage which is memorized in the moving type component supply device related information memorizing section. For example, when the detachable section is held on the movable member side section, by reading component related information by the information reading section, if information indicating that there is a component in a guiding passage but not in the component storage section is obtained, it is reported to perform component replenishment preparation.

The usage limit of electronic circuit components, in addition to being reached according to blackening and so on from usage, is reached when a time since manufacture elapses regardless of use. In the former case, in addition to the component supply count after component intake to the component storage section, for example, the time which the component storage section after component intake has been attached to the movable member side section may be accumulated and used for judging whether the usage limit has been reached. This time can be obtained by memorizing the date and time that the component storage section after component intake is attached to and removed from the movable member side section, or by obtaining and memorizing the attached time each time of attachment.

In the latter case, in other words in cases in which the usage limit of electronic circuit components is reached regardless of their use, the manufacture date of the electronic circuit components is memorized on the information memorizing section of the detachable section to be used for judging whether the usage limit of the components has been reached. Also, if the aging of electronic circuit components starts by their release from packaging such as by the bag in which electronic circuit components are put into after manufacture being opened, the package release day may be memorized in the information memorizing section and used for judging whether the usage limit of the components has been reached. With regard to the detachable section too, if the usage limit is reached by time since manufacture elapsing regardless of use, the manufacture date of the detachable section may be memorized on the information memorizing section to be used for judging the usage limit. The usage limit of components and the detachable section may be set automatically by the control device. For example, if the ratio of the occurrence count of pickup errors with respect to the component supply count exceeds a set ratio, the component supply count in that case is made the component supply count which defines the usage limit.

The amount of components currently stored in the component storage section can be acquired from at least one of the quantity and the weight. Also, in the moving type component supply device related information memorizing section, instead of, or together with, identification information of the detachable section, identification information of the components stored in the component storage section may be memorized. As identification information of the components, for example, the component model number is used.

It is desirable for identification information of at least one out of the moving type component supply device, the component storage section, and the components stored in the component storage section which is reported together with the moving type component supply device state information from the moving type component supply device state information reporting section to include at least one out of information indicating the type and identification information attached individually to each one. Also, each type of reporting, such as component replenishment requests and component usage limit reached reports, is performed together with at least one of identification information of moving type component supply device, component storage section, and components stored in the component storage section, as required.

It is not essential for all the moving type component supply device related information to be memorized on the information memorizing section provided on the detachable section, only a part thereof may be memorized. For example, identification information of the detachable section is memorized in the information memorizing section, and at least a part of the other information is linked to the identification information of the detachable section and memorized in the information memorizing section of the host computer. Information memorized in the information memorizing section of the host computer may be read, used, and if necessary updated, based on the identification information. In cases in which the host computer manages multiple electronic circuit component mounters, at whichever electronic circuit component mounter a detachable section is used, the latest information regarding this can be obtained.

On the information memorizing section provided on the detachable section, there is a writable information memorizing section and a non-writable information memorizing section. For the former, there is, for example, an RFID (Radio Frequency Identification) tag; for the latter, there is, for example, a barcode or two-dimensional code. If a commercially available writable paper label is used, a barcode or two-dimensional code can be used as a writable information memorizing section. The information reading section, is configured from, for example, a code reader or RFID reader-writer such as a barcode reader or two-dimensional code reader.

Also, as the information memorizing section provided on the detachable section, it is also possible to use a memorizing section except for non-contact communication memory such as an RFID tag, for example, memory for which communication is performed by being connected electronically can be used.

The detachable section not present judging section may judge that a detachable section is not attached to the movable member side section based only on the fact that reading of information of the information memorizing section cannot be performed.

The antenna of RFID reader-writer 603 provided on passage-equipped component case exchange device 31 does not have to be provided together with the component case holding section, and one may be provided for shared use for multiple component case holding sections. For example, a shared antenna is provided movably in a direction parallel to the direction in which multiple component case holding sections are lined up on a rear section protruding forwards from mounter module 10 of exchange device main body 500. The shared antenna is moved by an antenna moving device provided on exchange device main body 500 to selectively face RFID tag 330 of each passage-equipped component case 252 held on component case holding sections 550 and 552 of slide 502 moved to the rear limit position, and communication is performed between RFID 330 and RFID reader-writer 603. It is also acceptable to fixedly provide the shared antenna on exchange device main body 500 and to have the shared antenna selectively face two RFID tags 330 by the movement of slide 502.

When the storage-section-use component sensor is configured from a transmission type photoelectric sensor, it is acceptable if only the section of case member 262 which corresponds to the light path is transparent.

Also, when a non-reflective section is provided on the guiding passage to detect the presence of components inside the guiding passage, an opening may be formed in the bottom surface of the guiding passage to act as the non-reflective section. It is desirable for this opening to be filled with transparent material.

Also, the component remaining quantity inside the storage chamber can be detected by providing multiple photoelectric sensors spaced at regular intervals in the vertical direction, or by providing a line sensor in the vertical direction, as the storage-section-use component sensor.

At least one of a storage-section-use component sensor and guiding-passage-use component sensor may be used as a detachable section sensor, and the detection signal thereof may be used to judge whether a detachable section is attached to the movable member side section. As a detachable section sensor, a sensor which detects any of the configuring members of the detachable section, for example, the component storage case or the guiding passage forming body, may be provided on the movable member side section.

Only one out of a storage-section-use component sensor and guiding-passage-use component sensor may be provided, in which case, that one is provided on a movable member side section which cannot be attached/removed together with the detachable section. When both a storage-section-use component sensor and guiding-passage-use component sensor are provided, only one of those may be provided on the movable member side section, or both of those may be provided on the movable member side section.

When both a storage-section-use component sensor and guiding-passage-use component sensor are provided, it is desirable for those to be provided on the movable member side section in a position away from the movement axis path of when the detachable section is attached/removed to/from the movable member side section.

It is desirable for the detachable section to be attached/removed to/from the movable member side section vertically, but this is not essential. For example, it is possible to be attached/removed in the horizontal direction. More specifically, when the component storage section has a flat shape extending in a vertical plane, it may be attached/removed in a parallel direction or a perpendicular direction to that flat shape.

It is possible for the storage-section-use component sensor to be a transmission type sensor equipped with a light emitting section and light receiving section respectively provided at both ends of the light path, or to be a reflecting type sensor which includes a reflector provided at one end of the light path, and a light projecting section for projecting light to that reflector and a light receiving section for receiving reflected light from the reflector; and it is desirable for the reflector to be arranged between both internal surfaces of both main walls of the component storage case, and for the light projecting section and light receiving section to be arranged in the space between both extending flat surfaces which extend to one side of both external surfaces of both main walls.

As a storage-section-use component sensor, a weight sensor which detects the weight of components stored in the component storage section can also be used.

When providing a guiding-passage-use component sensor, in cases in which the surface of the bulk components has high light reflectance, a non-reflective section is provided on the lower end of the light path, and the light receiving section receives light reflected from the bulk components. The non-reflective section has a low reflectance surface on which blackening or the like has been performed on at least the internal surface of the section of the horizontal guiding passage section which faces the light projecting section; or at least the section of the horizontal guiding passage section which faces the light projecting section is formed from transparent material, or is an opening. Conversely, in cases in which the surface of bulk components has low light reflectance, a reflective section is provided on the lower end of the light path. Although the terms "non-reflective section" and "reflective section" are used, this section only needs to have a clearly lower, or higher, light reflectance compared to the surface of the bulk components.

The cover which covers the opening of the groove which forms the guiding passage may be transparent only in the section corresponding to the component detection position.

One example of a detachable section presence judging section includes a detachable section sensor, but this is not essential. For example, items such as the following can also be used: an item which judges the presence of a detachable section based on the imaging result of the component imaging device which captures from below an image of an electronic circuit component held on a component holding tool; an item which judges the presence of a detachable section based on the size of the drive current of the electric motor which forms the driving source or the force applied on the moving device during acceleration or deceleration of the movable member; or an item which, in cases in which a detachable section is held on the movable member side section, judges the presence of a detachable section based on the memorization of the fact that detachable section holding device has performed holding operation of a detachable section each time a series of board productions is performed (when component mounting is performed on a set quantity of circuit substrates). Also, one example of a detachable section required judging section judges based on the mounting control program, but this is not essential. For example, an item can be used which judges based on required/not required information inputted from an input device by an operator, or based on required/not required information acquired automatically according to the electronic circuit name which should be assembled, and so on.

For the mounting control program dependent required judging section, as well as it being possible to judge from a readout of information when that information is included in the information itself indicated by the mounting control program as to whether a detachable section is required as described in the present embodiment, for example, it is possible to judge whether a detachable section is required based on whether a command instructing movement to the detachable section stocker is included in the mounting control program, or whether the type of electronic circuit component supplied from a detachable section is included, and so on.

Also in cases in which both electronic circuit components supplied from a moving type component supply device and electronic circuit components supplied from a fixed position component supply device are mounted on one circuit substrate; it may be such that when electronic circuit components supplied from a fixed position component supply device are mounted, the detachable section is removed from the movable member side section; and when electronic circuit components supplied from a moving type component supply device are mounted, the detachable section is attached to the movable member side section.

If mounting of only electronic circuit components supplied from a moving type component supply device is performed onto a circuit substrate at an electronic circuit component mounter, a detachable section must always be attached to the movable member side section, a detachable section required judging section may be omitted, and only a detachable section presence judging section be provided.

The detachable section stocker and automatic attachment/removal device can be configured as separate devices from each other, or can be devices sharing at least one section. In the former case, for example, the detachable section stocker is equipped with multiple storage sections which store detachable sections; and the automatic attachment/removal device performs transfer of a detachable section between that detachable section stocker and the movable member side section. In the latter case, for example, multiple shared detachable section stocker and automatic attachment/removal devices are provided, and each of them holds as is a detachable section removed from a movable member side section, and attaches it to a movable member side section when it next becomes required.

The attachment/removal of a detachable section to/from a movable member side section may be performed manually by an operator.

In cases in which a detachable section does not have to be attached to a movable member side section and the detachable section is removed from the movable member side section, a substitute member may be held on the movable member side section instead of the detachable section.

The substitute member, for example, can be an item used to, in a state in which the component storage section and guiding passage forming section of the moving type bulk component supply device are removed from the movable member, cover the component driving device instead of the component storage section and guiding passage forming section to prevent the component driving device being exposed; or in cases in which an operation permission condition of the moving device is that the clamping device which fixes the detachable section to the movable member side section is in a clamped state, with the purpose of allowing operation of the moving device without attaching a detachable section to the movable member side section, can be an item for making the clamping device into a clamped state. In either case it is desirable to make the substitute member have a small a weight as possible. The smaller the weight that is moved by the moving device, the greater the acceleration and deceleration of the movable member, which can make the throughput of the electronic circuit component mounter greater.

As a substitute member, for example, a dummy member, an empty detachable section which does not hold electronic circuit components, or a cover member can be used. A dummy member imitates the outer appearance of a detachable section and has a configuration to be held on the movable member side section in the same way as a detachable section, but does not have component supply functionality; a cover member has a configuration to be held on the movable member side section and a shape and dimensions to cover at least one section of the section of the movable member side section from which the detachable detection was removed.

In a moving type bulk component supply device, attachment/removal to/from a movable member side section including a component storage section and a guiding passage forming section is possible, and attachment/removal to/from a movable member side section together with both a component storage section and a guiding passage forming section is possible. When the moving type bulk component supply device includes a component driving device, the component driving device may be attachable/removable to/from the movable member side section, or may be non-detachable.

Also, the component driving device of the moving type bulk component supply device may be, in addition to a device with the form disclosed in the above embodiment, for example, as disclosed in JP-A-2013-69798, a device which has an electric motor as a driving source, and encourages the transfer of components to a guiding passage by raising/lowering a tube, and inserting and evacuating the tube into/from components stored in a component storage case.

It is not essential for the moving type bulk component supply device to include a component driving device. For example, if components enter the guiding passage from the component storage section by their own weight, a component driving device can be omitted.

One moving type component supply devices may be provided, or multiple moving type component supply devices may be provided.

Information memorized on the information memorizing section of the detachable section of the moving type component supply device may be read by a reading device outside the component mounter, for example, may be used to understand the state of the detachable section, or information may be written by a writing device.

It is not essential for the mounting device to include a mounting head which can be attached/removed to/from a movable member, a component holding tool and so on may be provided with a movable member as a head main body.

REFERENCE SIGNS LIST

24: Moving type bulk component supply device; 26: Mounting device; 31: Passage-equipped component case exchange device; 32: Module control device; 40: Circuit board; 120: Mounting head; 122: Head moving device; 172: Suction nozzle; 180: Head main body; 220: Component imaging device; 222: Lighting device; 252: Passage-equipped component case; 254: Component driving device; 256: Component storage case; 258: Guiding passage forming body; 270, 306: Guiding passage; 316: Component supply section; 330: RFID tag; 340: Dropped component catch plate; 346: Sheet; 380: Passage-equipped component case attachment device; 382, 384: Clamping device; 410: RFID reader-writer; 450: Storage-section-use component sensor; 452: Guiding-passage-use component sensor; 480: Mounting head control device; 506, 508: Component case holding/raising/lowering device

The invention claimed is:

1. An electronic circuit component mounter, comprising:
a substrate holding device to hold a circuit substrate;
a component supply device to supply electronic circuit components;
a mounting device, including (a) a component holding tool, (b) a movable member to hold the component holding tool, and (c) a moving device to move at least the movable member relative to the substrate holding device;
a detachable section stocker to store detachable sections:
an automatic attachment/removal device which automatically performs attachment of a first detachable section stored in the detachable section stocker to a movable member side section, and storage of a second detachable section held in the movable member side section to the detachable section stocker; and
a control device to control the mounting device so that the electronic circuit components are received by the component holding tool from the component supply device and mounted on the circuit substrate held by the substrate holding device,
wherein the component supply device includes a moving type component supply device which is held on the movable member and moved together with the component holding tool by the moving device and supplies the electronic circuit components to the component holding tool,
wherein the moving type component supply device includes at least a component storage section which stores the electronic circuit components and is equipped with a detachable section which is detachable with a movable member side section of a side of the movable member,
wherein the electronic circuit component mounter includes a detachable section presence judging section which judges whether the detachable section is attached to the movable member side section; and a detachable section required judging section which judges whether to attach the detachable section to the movable member side section,
wherein the component supply device includes, in addition to the moving type component supply device as a first component supply device, a second component supply device which is not moved by the moving device, and
wherein the control device controls the moving device and the automatic attachment/removal device so that the detachable section is removed from the movable member side section and transferred to the detachable section stocker in cases in which the detachable section presence judging section judges that the detachable section is attached to the movable member side section even though the detachable section required judging section has judged that the detachable section is not required.

2. The electronic circuit component mounter according to claim 1,
wherein the detachable section presence judging section is provided on the movable member side section and includes a detachable section sensor which detects whether the detachable section is attached to the movable member side section.

3. The electronic circuit component mounter according to claim 1,
wherein the moving type component supply device is a moving type bulk component supply device equipped with (i) the component storage section which stores the electronic circuit components in a loosely packed state as bulk components, and (ii) a guiding passage forming section which forms a guiding passage which guides the electronic circuit components from the component storage section to a component supply section in a lined up state.

4. The electronic circuit component mounter according to claim 3,
wherein the moving type bulk component supply device, in addition to the component storage section and the guiding passage forming section, is equipped with a component driving device which transfers the electronic circuit component which are inside the component storage section into the guiding passage, and
wherein the component storage section and the guiding passage forming section are the detachable section which is removable from the movable member side section while the component driving device is held on the movable member side section.

5. The electronic circuit component mounter according to claim 1,
wherein the control device includes a main control section to control the mounting device based on a mounting control program, and
wherein the detachable section required judging section includes a mounting control program dependent required judging section which judges whether the detachable section is required based on the mounting control program.

\* \* \* \* \*